(12) United States Patent
Yasukawa et al.

(10) Patent No.: US 9,257,966 B2
(45) Date of Patent: Feb. 9, 2016

(54) CLOCK CORRECTION CIRCUIT AND CLOCK CORRECTION METHOD

(71) Applicant: Renesas Electronics Corporation, Kawasaki-shi, Kanagawa (JP)

(72) Inventors: Tomoki Yasukawa, Kanagawa (JP); Kazuyoshi Kawai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/340,044

(22) Filed: Jul. 24, 2014

(65) Prior Publication Data

US 2014/0333349 A1    Nov. 13, 2014

Related U.S. Application Data

(63) Continuation of application No. 13/929,365, filed on Jun. 27, 2013, now Pat. No. 8,823,434.

(30) Foreign Application Priority Data

Jun. 29, 2012  (JP) ................................. 2012-147814

(51) Int. Cl.
  *H03K 5/156*   (2006.01)
  *H03K 3/011*   (2006.01)
  *G06F 13/16*   (2006.01)

(52) U.S. Cl.
  CPC ............ *H03K 3/011* (2013.01); *G06F 13/1689* (2013.01); *H03K 5/156* (2013.01)

(58) Field of Classification Search
  CPC .......... G06F 13/1689; G06F 1/06; G06F 1/08; H03K 5/156; H03K 5/1565
  USPC .......................... 327/113, 114, 115, 172, 175
  See application file for complete search history.

(56) References Cited

U.S. PATENT DOCUMENTS

| 8,513,996 | B2 | 8/2013 | Kim et al. | |
| 2009/0128207 | A1* | 5/2009 | Chang et al. | ............... 327/175 |
| 2010/0109725 | A1 | 5/2010 | Yun et al. | |

FOREIGN PATENT DOCUMENTS

JP           2000-315121 A      11/2000

OTHER PUBLICATIONS

"URL: http://www.sii.co.jp/components/quartz/ocdpJP.jsp" on the Internet (available on Jun. 1, 2012); 2 pages.
"URL: http://www.tamadenvice.co.jp/32768-temp.htm" on the Internet (available on Jun. 1, 2012); 1 page.

* cited by examiner

*Primary Examiner* — John Poos
(74) *Attorney, Agent, or Firm* — Foley & Lardner LLP

(57) ABSTRACT

An operation clock generation circuit performs calculation on the basis of the frequency errors of a fundamental clock and the clock pulses of the fundamental clock, and generates an operation clock obtained by correcting the frequency errors at first intervals. A correction clock generation circuit converts a lower-bit value that is a value represented by the bits lower than the predefined bit used for judging the change of the state of the operation clock into a count number of the clock pulses of a second clock whose frequency is higher than that of the operation clock, generates a correction clock obtained by correcting the operation clock on the basis of a time required for counting the count number of the clock pulses and the clock pulses of the operation clock.

8 Claims, 22 Drawing Sheets

FIG. 6

| FREQUENCY ERROR | VALUE CONVERTED TO REGISTER VALUE (d) OF FF114 | CORRECTION VALUE (NEGATIVE NUMBER IS REPRESENTED BY TWOS COMPLEMENT) |
|---|---|---|
| ... | ... | ... |
| −100 ppm | 1FFF98 H | 1FFFA8 H |
| ... | ... | ... |
| −31.4 ppm | 1FFFDF H | 1FFFFF H |
| −30.5 ppm | 1FFFE0 H | 000000 H |
| −29.6 ppm | 1FFFE1 H | 000001 H |
| ... | ... | ... |
| −1.91 ppm | 1FFFFE H | 00001E H |
| −0.95 ppm | 1FFFFF H | 00001F H |
| 0 ppm | 000000 H | 000020 H |
| 0.95 ppm | 000001 H | 000021 H |
| 1.91 ppm | 000002 H | 000022 H |
| ... | ... | ... |
| 100 ppm | 000068 H | 000088 H |
| ... | ... | ... |

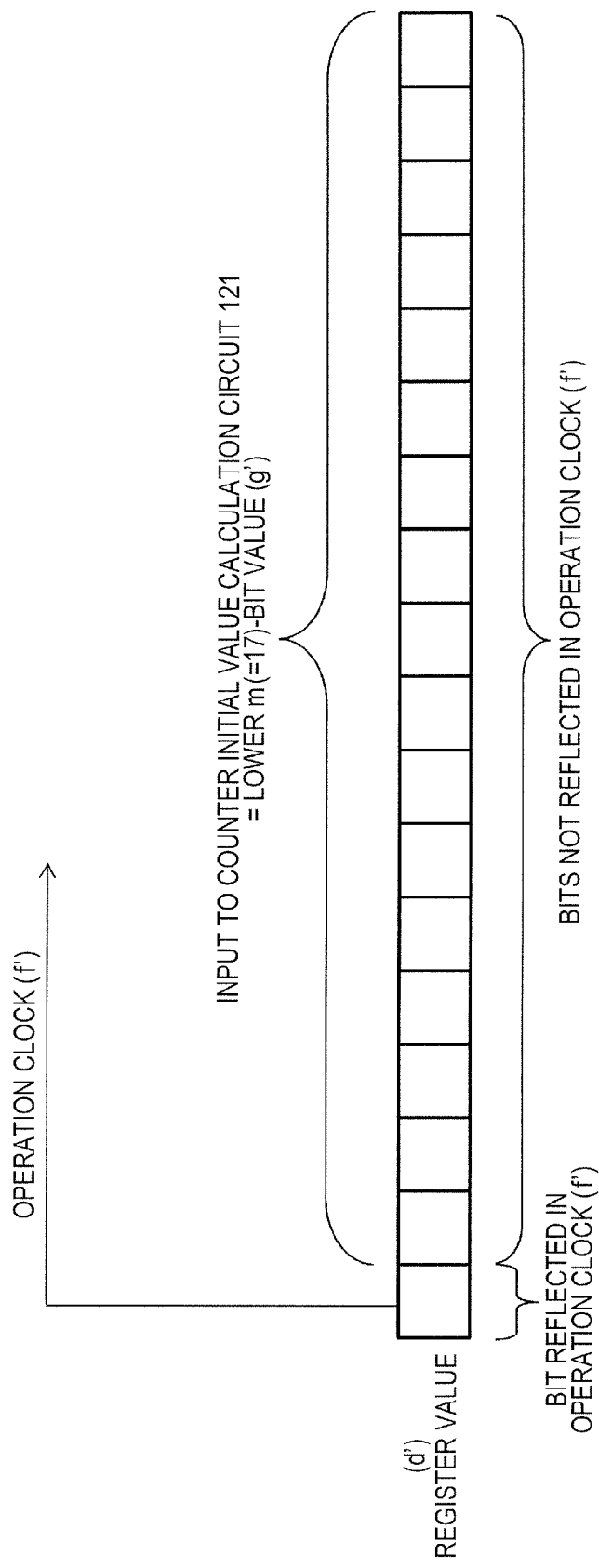

CLOCK CORRECTION CIRCUIT AND CLOCK CORRECTION METHOD

CROSS-REFERENCE TO RELATED APPLICATIONS

This application is a continuation of U.S. application Ser. No. 13/929,365, filed Jun. 27, 2013, which claims benefit of priority from the prior Japanese Application No. 2012-147814, filed Jun. 29, 2012; the entire contents of all of which are incorporated herein by reference.

BACKGROUND

The present invention relates to clock correction circuits and clock correction methods, and more particularly relates, for example, to a clock correction circuit and clock correction method used for a power meter and the like.

Recently, RTCs (Real Time Clocks) have been widely used in many information devices. One of examples on which an RTC is mounted is a power meter. The power meter calculates electricity charges and the like on the basis of the time period measured by the RTC. Generally, a tuning fork type crystal oscillator is used for generating the operation clock of the RTC, and the temperature characteristic of the frequency of the tuning fork type crystal oscillator is represented by a quadratic function that has a negative quadratic coefficient with about 25° C. as the center temperature. The temperature characteristic has, for example, a deviation about −150 ppm (parts per million) at the temperature −40° C. If the operation clock of the RTC has a deviation in its practical usage, the time period measured by the RTC has an error. Therefore, the correction of the frequency deviation of the operation clock is needed.

For example, in the power meter market, it is required that the accuracy of the clock generated by the RTC is within ±3 ppm or ±5 ppm. In the manufacturing process of power meters on which RTCs are mounted, it is inspected whether the clocks, the frequency errors of which have already been corrected, operate within desired accuracy or not. This inspection method is performed in a way that a clock (for example, 1 Hz) obtained by dividing a clock (for example, 32,768 kHz) generated by a crystal oscillator of an RTC is output from a terminal and that it is inspected whether the output clock satisfies the above-mentioned accuracy (±3 ppm, or ±5 ppm). Therefore, if 1 Hz clock is generated from the output clock of a crystal oscillator 32.768 kHz, the greatest accuracy of the generated clock is 30.5 ppm (1 Hz/32.768 kHz). The accuracy of this clock does not satisfy the accuracy required by the power meter market.

Japanese Unexamined Patent Application Publication No. 2000-315121 discloses an RTC circuit of a simple configuration that is capable of performing time correction with a high accuracy. The above RTC circuit includes an oscillator that generates a fundamental clock (for example, 32.768 kHz), and generates a frequency-divided signal obtained by dividing the fundamental clock. Further, the RTC circuit calculates the frequency errors of the fundamental clock generated by the oscillator with the use of a reference clock that is higher and more accurate than the fundamental clock. Successively, using the frequency-divided signal as a clock, an oscillator with a correction function in the RTC adds fixed values and the frequency errors, and outputs the MSB (Most Significant Bit, highest bit) of the addition result value as a correction clock. When the correction clock is generated, the frequency errors are accumulatively added, and when the accumulated value is reflected in the above MSB, the state of the correction clock is reversed, which corrects the frequency errors.

SUMMARY

As described above, the RTC circuit generates a correction clock for correcting the accumulated value of the frequency errors in a lot when the accumulated value of the frequency errors reaches a certain value. In this case, the correction clock includes the frequency errors during the time until the accumulated value of the frequency errors reaches the certain value. For example, if it takes a time period X for the accumulated value reaches to the certain value, the correction clock is in the state of including the frequency errors within the time period X. Therefore, if a test for examining whether or not the correction clock satisfies the predefined accuracy (for example, ±3 ppm (21 to 25° C. takes a time longer than the time period X that is a time period required for the accumulated value of the frequency errors to be corrected, which leads to a long time needed to perform the test. In addition, because the correction is not performed every occurrence of the pulse of the correction clock, this correction clock can not be used, for example, as a recovery pulse.

In other words, in the case where the RTC circuit disclosed in Japanese Unexamined Patent Application Publication No. 2000-315121 is used, there is a problem in that the correction clock can not always satisfy desired accuracy when the frequency error of the correction clock is detected at an arbitrary time.

According to one aspect of the present invention, a clock correction circuit performs accumulation while taking the required frequency of the operation clock and the frequency errors of a first clock into consideration, and changes the state of the operation clock when the predefined bit of the accumulated value changes, and the clock correction circuit further extracts a lower-bit value that is a value represented by the bits lower than the predefined bit from the accumulated value as well. Successively, the clock correction circuit generates a correction clock obtained by correcting the operation clock with the use of this lower-bit value and a second clock that has a higher frequency than that of the operation clock.

According to the above-mentioned aspect of the present invention, a correction clock that satisfies desired accuracy can be generated even when the frequency error of the correction clock is detected at an arbitrary time.

BRIEF DESCRIPTION OF THE DRAWINGS

FIG. 6 is a table showing the relation between the frequency errors of a fundamental clock (a) and correction values according to the first embodiment of the present invention;

FIG. 22 is a schematic diagram showing the configuration of an embedded register of a flip-flop according to the another embodiment of the present invention.

DETAILED DESCRIPTION

Figure 1:
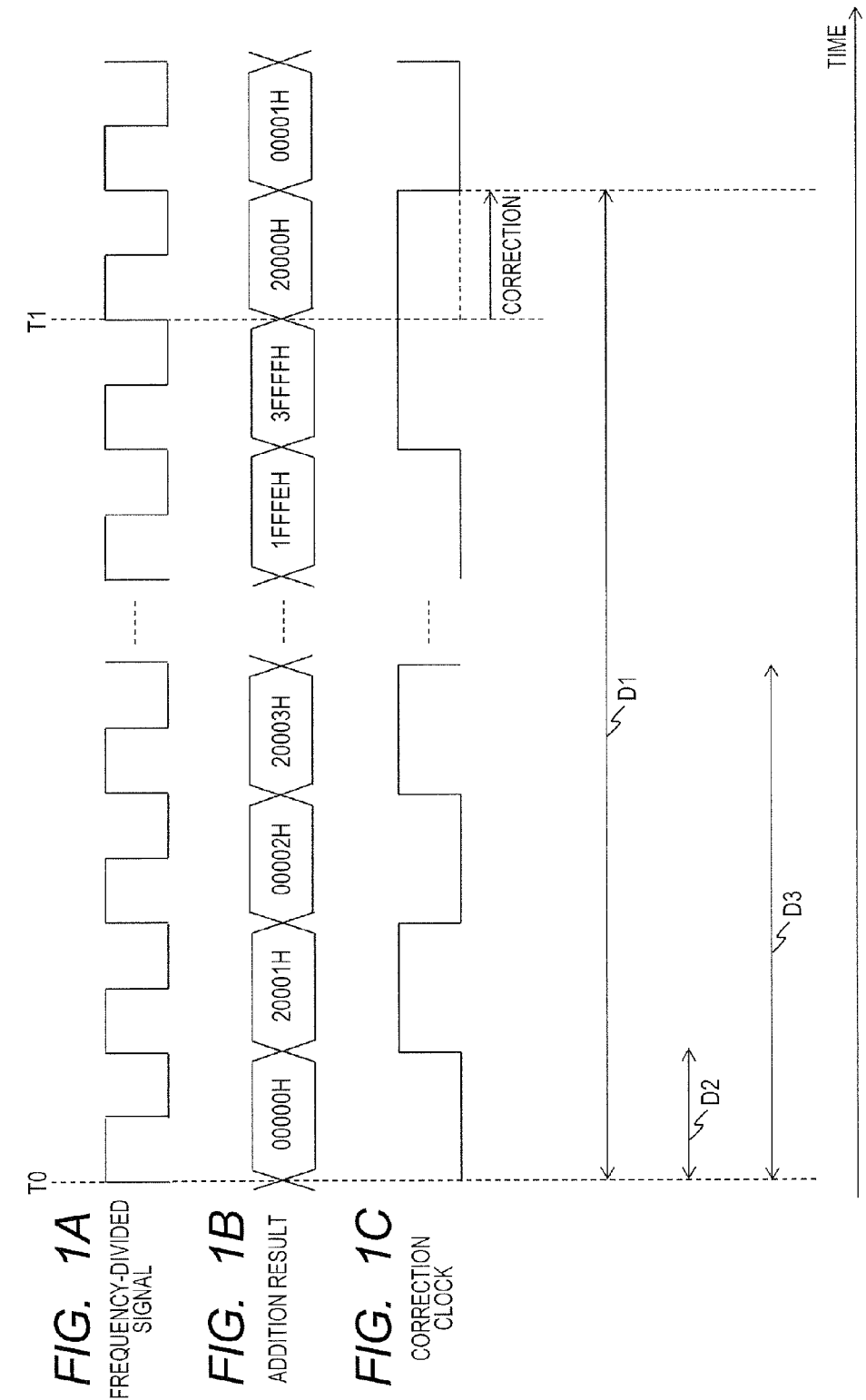
FIG. 1A to FIG. 1C are timing charts showing the operation of an RTC circuit according to Japanese Unexamined Patent Application Publication No. 2000-315121.

Before the description of a clock correction circuit according to this embodiment of the present invention, a problem posed by the RTC circuit disclosed in Japanese Unexamined Patent Application Publication No. 2000-315121 will be further described with reference to FIGS. 1A to 1C. FIGS. 1A to 1C are timing charts showing the operation of the RTC circuit according to Japanese Unexamined Patent Application Publication No. 2000-315121. FIG. 1A shows a frequency-divided signal used in the RTC circuit disclosed in Japanese Unexamined Patent Application Publication No. 2000-315121. FIG. 1B shows the above-mentioned addition result value used in the RTC circuit disclosed in Japanese Unexamined Patent Application Publication No. 2000-315121. The fixed value used in FIG. 1B is "20000H". FIG. 1C is a diagram showing the correction clock output by the RTC circuit disclosed in Japanese Unexamined Patent Application Publication No. 2000-315121. The RTC circuit starts running at timing T0.

At timing T1, the accumulated frequency errors (the frequency error "1" accumulatively added to the summation value per pulse of the divided signal in the example shown in FIG. 1A to FIG. 1C) are reflected in the MSB of the addition result value in FIG. 1B. It is at this timing T1 that the correction clock (FIG. 1C) is corrected. In other words, the value of the correction value remains high-level instead of becoming low-level. In this case, the frequency errors of the correction clock during the time period D1 are within the predefined accuracy because of this correction processing. The time period D1 is an elapsed time from the time at which the RTC circuit starts running to the time at which the first correction is performed. However, the frequency errors during a time period shorter than the time period D1 such as during the time periods D2 or D3 may not satisfy desired accuracy because the correction processing is not performed.

As shown in FIG. 1C, a clock which is corrected once during a certain time period (D1) is a clock used for timekeeping in a typical RTC circuit. Therefore, a clock which is corrected once during a certain time period (D1) as shown in FIG. 1C will be referred to as an "operation clock" in the following descriptions. On the other hand, a clock which is corrected at an interval of one pulse (D2) will be referred to as a "1-pulse correction clock". In addition, as shown by the time period D1, a pulse width in which a clock signal changes from high-level to low-level (or from low-level to high-level) will be referred to as one pulse.

First Embodiment

A clock correction circuit according to a first embodiment of the present invention will be described appropriately referring to the drawings hereinafter.

<Configuration of Power Meter (Electronics Device)>

Figure 2:
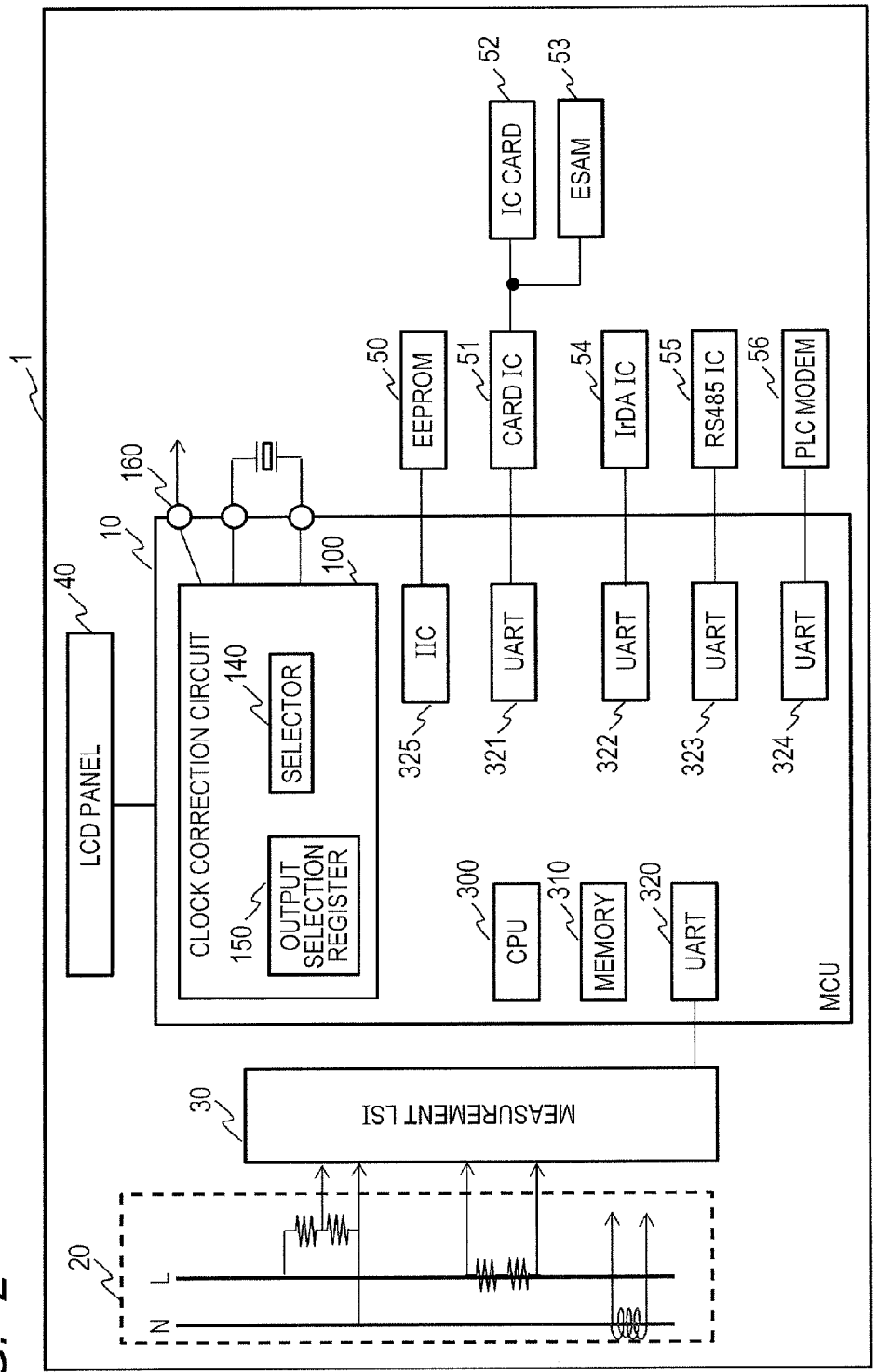
FIG. 2 is a block diagram showing the configuration of a power meter including a clock correction circuit according to the first embodiment of the present invention.

First, the outline of an electronics device on which the clock correction circuit according to this embodiment is mounted will be explained. FIG. 2 is a diagram showing the outline of a power meter device that is an example of an electronics device on which the clock correction circuit according to this embodiment is mounted.

A power meter device 1 includes: an MCU (Micro Control Unit) 10; a measuring object unit 20; a measurement LSI (Large Scale Integration) 30; an LCD (Liquid Crystal Display) panel 40; an EEPROM 50; and various external interfaces (a Card IC 51, an IrDA IC 54, an RS485 IC 55, a PLC modem 56). In addition, the external interface Card IC 51 can be connected to various card devices (such as an IC Card 52 and an ESAM 53).

The measuring object unit 20 includes current detection sensors such as shunt registers and a CT (a current transformer) inside. The measurement LSI 30 measures the amount of electric energy consumed in the measuring object unit 20, and informs the MCU 10 of the measurement result. The LCD panel 40 displays the electric power charge calculated by the MCU 10 and the like.

The external interfaces (the Card IC 51, the IrDA IC 54, the RS485 IC 55, the PLC modem 56) are configured to be connected to UARTs (Universal Asynchronous Receiver Transmitters) 321 to 324 respectively, and various pieces of information are transmitted through these external interfaces. The EEPROM (Electrically Erasable Programmable Read-Only Memory) 50 is a storage device that is connected to an IIC 325 in the MCU 10. The EEPROM 50 stores accounting information inside.

Here, the account information is information that shows the relation between the amount of electric energy consumption and the corresponding accounting amount for each time zone. For example, the accounting information is information that shows the accounting amount per kW·h during the daytime (from 6 lock to 20 o'clock), the accounting amount per kW·h during the nighttime (from 20 o'clock to 30 o'clock), and the like in a tabular format.

The MCU 10 performs calculation processing of accounting amounts and the like with the use of the above accounting information and the amount of electric energy consumption calculated by the measurement LSI 20. The MCU 10 includes: a clock correction circuit 100; a CPU (Central Processing Unit) 300; a memory 310; UARTs 320 to 324; and the IIC 325.

The clock correction circuit 100 is a circuit that works as the so-called RTC (Real Time Clock), and is connected to an external terminal 160 of the MCU 10. An administrator of the power meter device 1 measures the frequency of a clock signal output from the external terminal 160, and examines whether the frequency satisfies a desired resolution or not at the time of examining (testing) the operation of the power meter device 10. In addition, the clock correction circuit 100 appropriately supplies time information that it has been measuring to the CPU 300 and the like. The internal configuration and operation of the clock correction circuit 100 will be described later with reference to FIG. 3 and the like.

The CPU 300 is a central processing unit that performs various controls inside the MCU 10. The CPU 300 calculates accounting amounts on the basis of the accounting information read out from the EEPROM 50, the time information supplied by the clock correction circuit 100, and the information about the amount of electric energy consumption supplied by the measurement LSI 20. The CPU 300 appropriately outputs the calculated accounting amounts to external devices (for example, a printer) and the LCD panel 40.

The memory 310 is, for example, a ROM (Read Only Memory), or a RAM (Random Access Memory), and stores various pieces of information. Although it has been assumed that the EEPROM 50 stores the accounting information in the above description, the memory 310 can store the accounting information instead of the EEPROM 50. The UARTs 320 to 324 are connected to the measurement LSI 30 and the external interfaces (the Card IC 51 and the like), and control the transmission of various pieces of information.

The MCU 10 includes a temperature sensor, an A/D converter, a clock oscillator, a reference oscillator, and the like although they are not shown in FIG. 2.

As shown in FIG. 2, the MCU 100 includes the external terminal 160 that is connected to the correction circuit 100. A configured value of an output selection register 150 includes types of output clock signals (a 1-pulse correction clock, an operation clock, and a fundamental clock without being corrected), which will be described in detail later. A later-described selector 140 selects an output clock signal on the basis of the configured value of the output selection register 150, and sends out selected output signal through the external terminal 160.

Because many circuits are activated in order to generate the 1-pulse correction clock, the amount of electric energy consumption of the 1-pulse correction clock is the largest compared with those of the other two clocks. However, the 1-pulse correction clock is error-free even if the frequency error about the 1-pulse correction clock is calculated during any time period. Although the amount of electric energy consumption needed for generating the operation clock is smaller than that for generating the 1-pulse correction clock, when the frequency error about the operation clock is calculated at any time period, there is a possibility that the operation clock does not satisfy desired accuracy. In other words, the 1-pulse correction clock is corrected at shorter time intervals than the operation clock is corrected. Although the smallest amount of power consumption is needed for generating the fundamental clock without being corrected, this is a clock that essentially includes the frequency error.

In other words, the clock correction circuit 100 sends out three types of clocks each of which has its own advantage and disadvantage through the external terminal 160. A user can select any clock signal out of the three clocks as needed. Therefore, an optimal clock signal can be used from the viewpoint of the application of the clock signal and the amount of power consumption of the clock signal.

Generally speaking, the 1-pulse correction clock is used only in the case where the operation of the power meter device 1 is examined before being put into actual use, and is rarely used in the usual usage of the power meter device 1. In other words, there is few case where plural clock signals are used at the same time. In the above described configuration of the clock correction circuit 100, the plural types of the clock signals can be output through the external terminal 160 in rotation, therefore the number of external terminals of MCU 10 can be reduced.

In stead of the 1-pulse correction clock, the selector 140 can selects, for example, a 2-pulse correction clock, and the like. The details about the 2-pulse correction clock and the like will be described later. In other words, it is preferable that the selector 140 is configured to be able to output the operation clock and a correction clock whose frequency errors are corrected at shorter time intervals than the frequency errors of the operation clock are corrected. It is more preferable that the selector 140 is configured to be able to output the 1-pulse correction clock.

<Configurations of Clock Correction Circuit 100 and Its Peripheral Circuits>

The schematic configuration of the clock correction circuit 100 will be explained with reference to FIG. 3. The clock correction circuit 100 includes: an operation clock generation circuit 110; a correction clock generation circuit 120; a clock counter 130; the selector 140; and the output selection register 150. The selector 140 is connected to the external terminal 160.

A fundamental clock (first clock) is supplied to the operation clock generation circuit 110 in the clock correction circuit 100 by a clock oscillator 210. The clock oscillator 210 is an oscillator that generates the fundamental clock (a). It will be assumed in the following descriptions that the frequency of the fundamental clock (a) is 32.768 kHz. Here, it should be noted that there are many cases where the fundamental clock (a) generated by the clock oscillator 210 has frequency errors large enough to be unacceptable to the power meter device 1. It will be assumed in the following descriptions that the error of the fundamental clock (a) does not exceeds 1 Hz. In other words, the frequency of the fundamental clock (a) does not become 32.769 kHz or 32.767 kHz. The clock oscillator 210 supplies the generated fundamental clock (a) to the operation clock generation circuit 110.

The operation clock generation circuit 110 reads out a fixed value (described later with reference to FIG. 5) from a register (storage unit) that is not shown. The operation clock generation circuit 110 outputs the operation clock (f) in which the frequency errors of the fundamental clock (a) are reflected on the basis of a correction value and the fixed value that are input to the operation clock generation circuit 110. In the following descriptions, it will be assumed that the operation clock (f) is a clock signal of 1 Hz which is generated on the basis of the fundamental clock (a) (32.768 kHz) and on which the correction of the frequency errors of the fundamental clock (a) is performed. Here, the correction value input to the operation clock generation circuit 110 (or the correction value read out by the operation clock generation circuit 110) is calculated with the use of the frequency error (represented in units of ppm) of the fundamental clock (a). As calculation methods of the frequency errors (represented in units of ppm), there are following three methods, for example. These calculation methods will be described in detail with reference to FIG. 14 to FIG. 19.

(1) The frequency errors of the fundamental clock (a) are calculated on the basis of a temperature detected by a temperature sensor and a temperature table.

(2) The frequency errors of the fundamental clock (a) are calculated by substituting a temperature detected by a temperature sensor into a relational expression between the temperature and the frequency error.

(3) The frequency errors of the fundamental clock (a) are calculated by an after-mentioned frequency error detector 170.

In addition, the operation clock generation circuit 110 supplies the operation clock (f) to the clock counter 130 and the correction clock generation circuit 120. In addition, the operation clock generation circuit 110 supplies a lower m-bit value (g), that is, the value represented by bits located under the predefined bit of a register, to the correction clock generation circuit 120. The lower m-bit value is used for judgment of the state change of the operation clock (f), which will be described later with reference to FIG. 5. The detailed configuration of the operation clock generation circuit 110 will be described later with reference to FIG. 4.

The correction clock generation circuit 120 calculates a 1-pulse correction clock (k) obtained by correcting the frequency errors of the fundamental clock (a) every one pulse of the 1-pulse correction clock (k) on the basis of the operation clock (f), the lower m-bit value (g) of the register (described later with reference to FIG. 4 and FIG. 5), and a second clock (h). Here, the second clock (h) is a clock that has a higher frequency than that of the fundamental clock (a) (for example, the frequency of the second clock (f) is 24 MHz). To be exact, it is necessary that the second clock is a clock that has a frequency higher than a frequency calculated from an equation (a required output frequency of the 1-pulse correction clock/a desired resolution of the 1-pulse correction clock). For example, if it is required that the correction clock generation circuit 120 generates the 1-pulse correction clock (k) that has a resolution 1 Hz corresponding to 1 ppm, the second clock (h) is set to be a clock that has a frequency higher than 1 MHz (1 Hz/1 ppm).

In addition, in the case where the correction clock generation circuit 120 reads out a value stored in the output selection register 150, it is conceivable that the correction clock generation circuit 120 generates the 1-pulse correction clock (k) only when the read-out value is a value to give directions to output the 1-pulse correction clock (k), and otherwise, the operation of the correction clock generation circuit 120 is stopped. Generally speaking, there is a case where the RTC circuit is used in a standby state, or there is a case where the RTC operates in a state of being supplied with electric power from a backup battery. In other words, there are many cases where the RTC is required to operate on a low-current consumption condition. Stopping the operation of the correction clock generation circuit 120 leads to the low current consumption achieved by the RTC. The detailed configuration and operation of the correction clock generation circuit 120 will be described later with reference to FIG. 9.

The clock counter 130 is a counter that measures the time in the real world by counting up the operation clock (f) output from the operation clock generation circuit 110. The clock counter 130 includes, for example, three counters (not shown) that respectively counts 60 seconds, 60 minutes, and 24 hours. The clock counter 130 appropriately supplies time information (in "SS-MM-HH" format) that it has been measuring to the CPU 300 and the like.

The selector 140 selects the operation clock (f) or the 1-pulse correction clock (k) in accordance with a value stored in the output selection register 150 and supplies the selected clock to the external terminal 160. In addition, the selector 140 can also supply the fundamental clock (a) to the external terminal 160 in accordance with the value stored in the output selection register 150, though this process is not shown. The value stored in the output selection register 150 can be rewritten by a user of the power meter device 1 (for example, an administrator of the power meter device 1) at an arbitrary timing.

<Configuration and Operation of Operation Clock Generation Circuit 110>

Next, the configuration of the operation clock generation circuit 110 will be described with reference to FIG. 4. The operation clock generation circuit 110 includes: a correction interval generation circuit 111; a selector 112; an adder 113; an FF (flip-flop) 114; and an operation clock correction circuit 115.

The correction interval generation circuit 111 generates a correction interval signal (b) that supplies a constant timing, that is, for example, a one-shot pulse of 1 Hz (a pulse being low-level during the time period of 32,767 clock pulses in series and high-level during the time period of 1 clock pulse among the time period of 32,768 clock pulses of the fundamental clock (a)) on the basis of the fundamental clock (a). The correction interval generation circuit 111 includes a frequency divider (which divides an input frequency by $2^{15}$) inside, and generates the above correction interval signal (b) and supplies the correction interval signal (b) to the selector 112 and the operation clock correction circuit 115. Here, the correction interval generation circuit 111 fulfills its role as long as it can generates a signal by which a constant timing is supplied, therefore the frequency of the correction interval signal (b) is not restricted to 1 Hz. However, it will be assumed that the frequency of the correction interval signal (b) is 1 Hz (in the form of one-shot pulse) in the following descriptions.

The selector 112 supplies the correction value to the adder 113 in the case where the correction interval signal (b) is high-level, and supplies the fixed value B to the adder 113 in the case where the correction interval signal (b) is low-level. In the case where the fundamental clock (a) does not have the frequency error, the correction value is equal to the fixed value B. A method for configuring the correction value and the fixed value B as well as the operation of the flip-flop 114 will be described later.

The adder 113 adds the output value (c) of the selector 112 and the output value of the flip-flop 114 (register value (d)), and supplies the addition result to the data terminal of the flip-flop 114.

The flip-flop 114 operates in accordance with the fundamental clock (a) as an input to its clock terminal. The flip-flop 114 includes an n-bit register. In the following descriptions, a value stored by the n-bit register of the flip-flop 114 is referred to as a register value (d). Because the frequency of the fundamental clock (a) is 32.768 kHz, the flip-flop 114 loads the addition result value obtained by adding the register value (d) of the flip-flop 114 and the output value (c) of the selector 112 32,768 times per second into the register value (d). Successively, the flip-flop 114 supplies the register value (d) to the operation clock correction circuit 115. To be exact, the flip-flop 114 supplies the operation clock (e) whose value changes at the timing of the second-highest bit of the register value (d) being switched and the lower m-bit value (g) of the register value (d) to the operation clock correction circuit 115.

Figure 5:
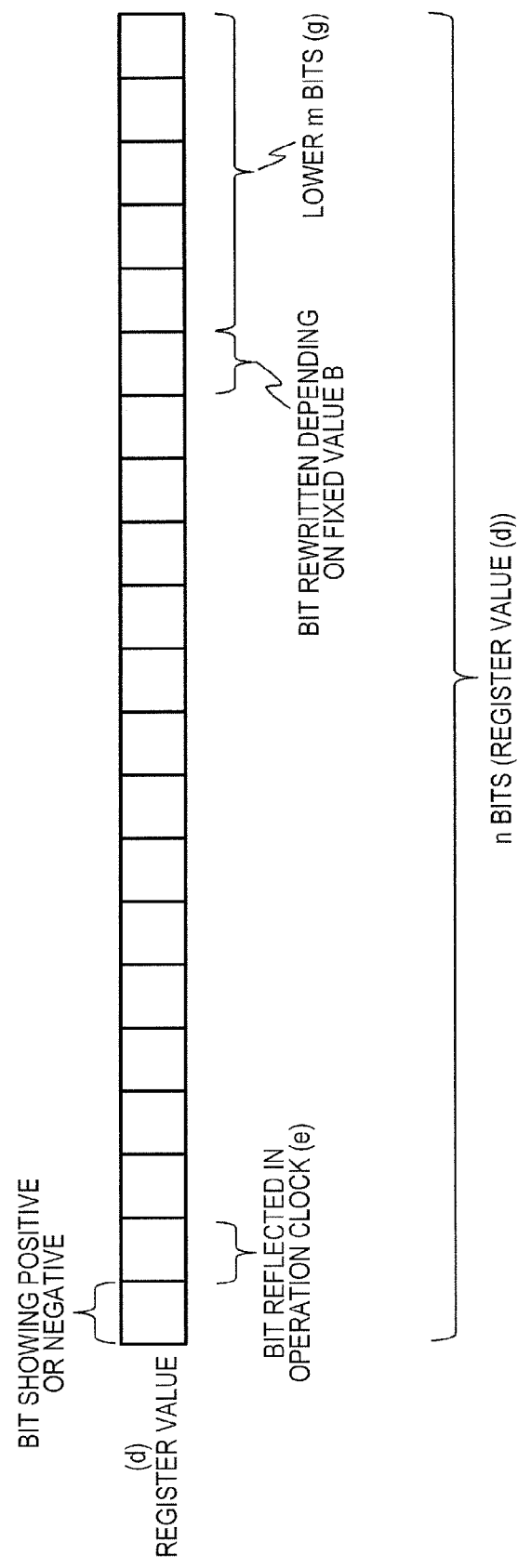
FIG. 5 is a schematic diagram showing the configuration of an embedded register of a flip flop according to the first embodiment of the present invention.

FIG. 5 is a diagram showing the configuration of the embedded register included in the flip-flop 114. The value of the register is rewritten 32,768 times per second. The highest bit of the flip-flop 114 is a bit that shows that the value is positive or negative. The value of the second-highest bit (pre-defined bit) is a value showing the state of the clock signal supplied to the operation clock correction circuit 115. This clock signal becomes an operation signal (an operation clock (e) that has not been corrected yet by the operation clock correction circuit 115.) The correction performed by the operation clock correction circuit 115 will be described later. If the fundamental clock (a) does not have the frequency error, the correction value is equal to the fixed value B, and the value in the register is incremented 32,768 ($2^{15}$) times. Therefore, the register has to have a bit width larger than a 16-bit width (1 sign bit+15 bits for representing $2^{15}$ binary numbers). FIG. 5 is a diagram showing a register having a 21-bit width.

The fixed value B is set to a value so that, if the fixed value B itself is accumulatively added 32,768 times, the accumulated value causes the second highest bit of the register value (d) may change. In other words, the fixed value B is determined in accordance with the required frequency of the operation clock (e). In FIG. 5, the fixed value B is set to a value represented by the register with "1" in the 6th-lowest bit (in the 16 (1+15)th-highest bit).

If the data width of the register is set to a 16-bit width, the minimum unit (the correction resolution) of the frequency error which can be corrected by the correction value is 30.5 ppm ($\frac{1}{2^{15}}$). In order to make the correction resolution higher, the bit width of the register has to be expanded to the lower side of the bits which is rewritten by the fixed value B. The larger the data width expanded to the lower side is, the finely the frequency error can be corrected with the use of the correction value and the higher the correction resolution is. If the expanded data width is set to m-bit width, the correction resolution becomes $\frac{1}{2^{15+n}}$. If m=5, the correction resolution becomes 0.95 ($\frac{1}{2^{15+5}}$) ppm, which satisfies the accuracy required from the power meter market. The following descriptions will be discussed on the assumption that m=5. In other words, it will be assumed that the data width of the register value (d) is a 21-bit width. In addition, the fixed value B is 000020H in hexadecimal. The value shown by the lower m bits of the register value (d) will be referred to as the lower m-bit value (g).

Next, a method for calculating the correction value from the frequency errors of the fundamental clock (a) will be described. Because the data width of the register value (d) is a 21-bit width (1 sign bit plus 20 bits), the LSB (Least Significant Bit) of the register value (d) corresponds to 0.95 ppm ($\frac{1}{2^{20}}$). For example, the frequency error 0.95 ppm corresponds to 000001H (in hexadecimal), and the frequency error −0.95 ppm corresponds to 1FFFFFH (in hexadecimal) in twos complement format.

The correction value is added when the correction interval signal (b) becomes high-level. In other words, when the correction interval signal (b) becomes high-level, the fixed value B is not added. Therefore, the correction value is calculated by adding a value obtained by converting the frequency error of the fundamental clock (a) into a value (an error value) corresponding to the register value (d) and the fixed value B. To be exact, if the data width of the register value (d) is a 21-bit width, the correction value is calculated with the use of [Expression 1] below. Here, "$10^6$" in [Expression 1] is used because the frequency error is represented in units of ppm (parts per million). For example, if the frequency error is 0.95 ppm, the correction value is 000021H (in hexadecimal). If the frequency error is −0.95 ppm, the correction value is 00001FH (in hexadecimal). FIG. 6 is a table showing the relation between the frequency errors of the fundamental clock (a) and the correction values in the case where the data width of the register value (d) is a 21-bit width. Because the correction value is calculated by adding the fixed value B and the error value, the adder 113 performs processing equivalent to accumulatively adding the fixed value B 32,768 times per second and reflecting the error value in the accumulative addition result (or adding the error value to the accumulative addition result) once per second.

$$\text{Correction Value} = \left(\frac{\text{Frequency Error [ppm]} \times 2^{20}}{10^6}\right)_H + 000020H \quad \text{[Expression 1]}$$

Figure 7:
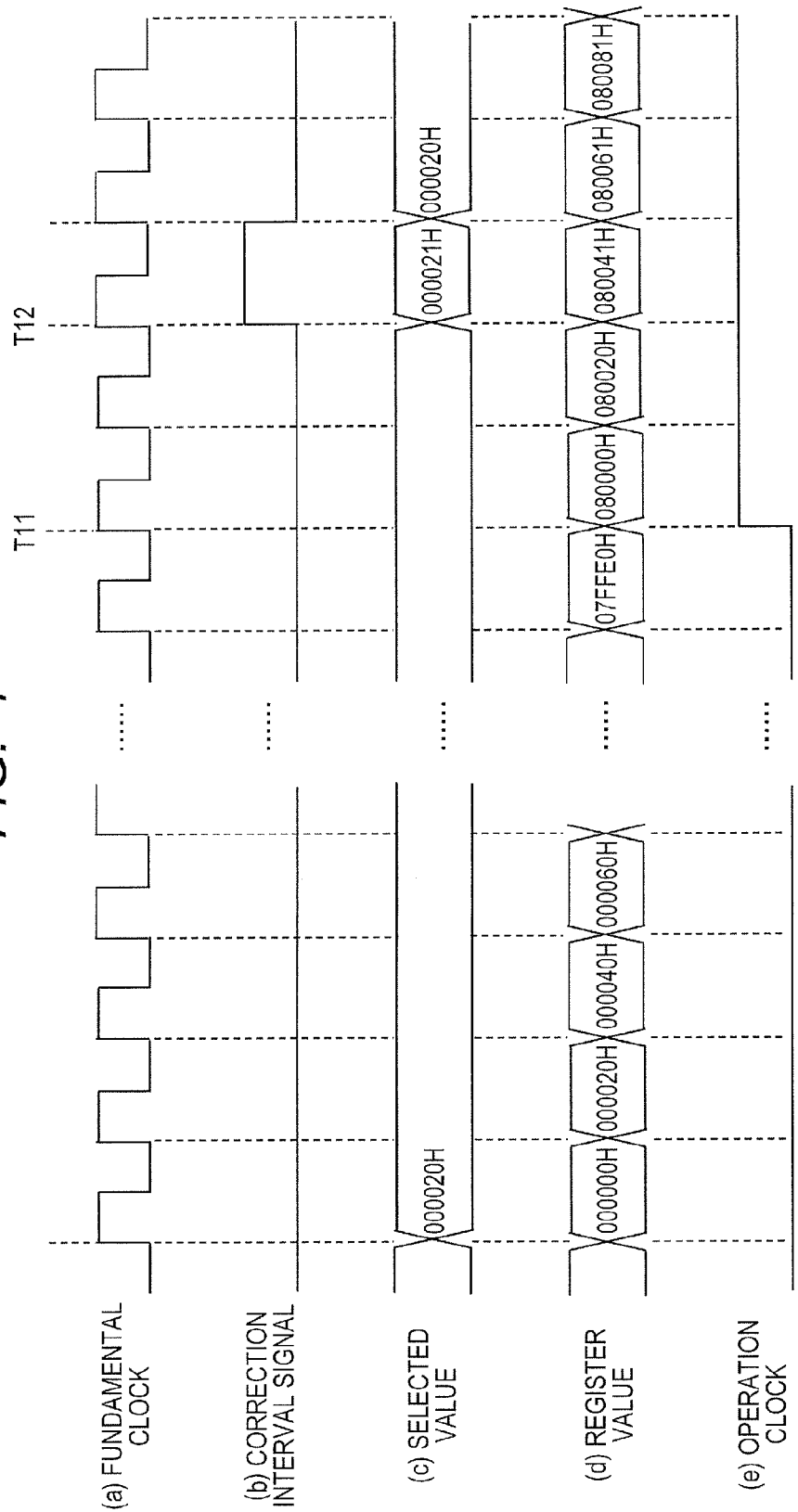
FIG. 7 is a timing chart showing the operation of the operation clock generation circuit according to the first embodiment of the present invention.

FIG. 7 is a timing chart showing the output signals of circuits in the operation clock generation circuit 110. The correction value in FIG. 7 is always set to 000021H for clarification of explanation.

The value of the fundamental clock (a) is switched 32,768 times per second. The correction interval signal (b) becomes high-level during one cycle of 32768 cycles of the fundamental clock (a) per second (the one cycle begins at timing T12). The selection value (c) of the selector becomes the correction value 000021H during the time when the correction interval signal (b) is high-level (the time begins at timing T12), and the selection value (c) becomes 000020H as the fixed value B during the other time.

The register value (d) accumulatively adds the selection values (c) of the selector, and changes the value of the operation clock (e) at the timing when the value of the second highest bit in the register changes (at timing T11). Here, the register value (d) is represented in hexadecimal in FIG. 7, therefore, the operation clock (e) changes from low-level to high-level when the register value (d) changes from 07xxxxH (x is an arbitrary number) to 08xxxxH (x is an arbitrary number), and changes from high-level to low-level when the register value (d) changes from 0FxxxxH (x is an arbitrary number) to 0x0000H (x is an arbitrary number).

Figure 8:
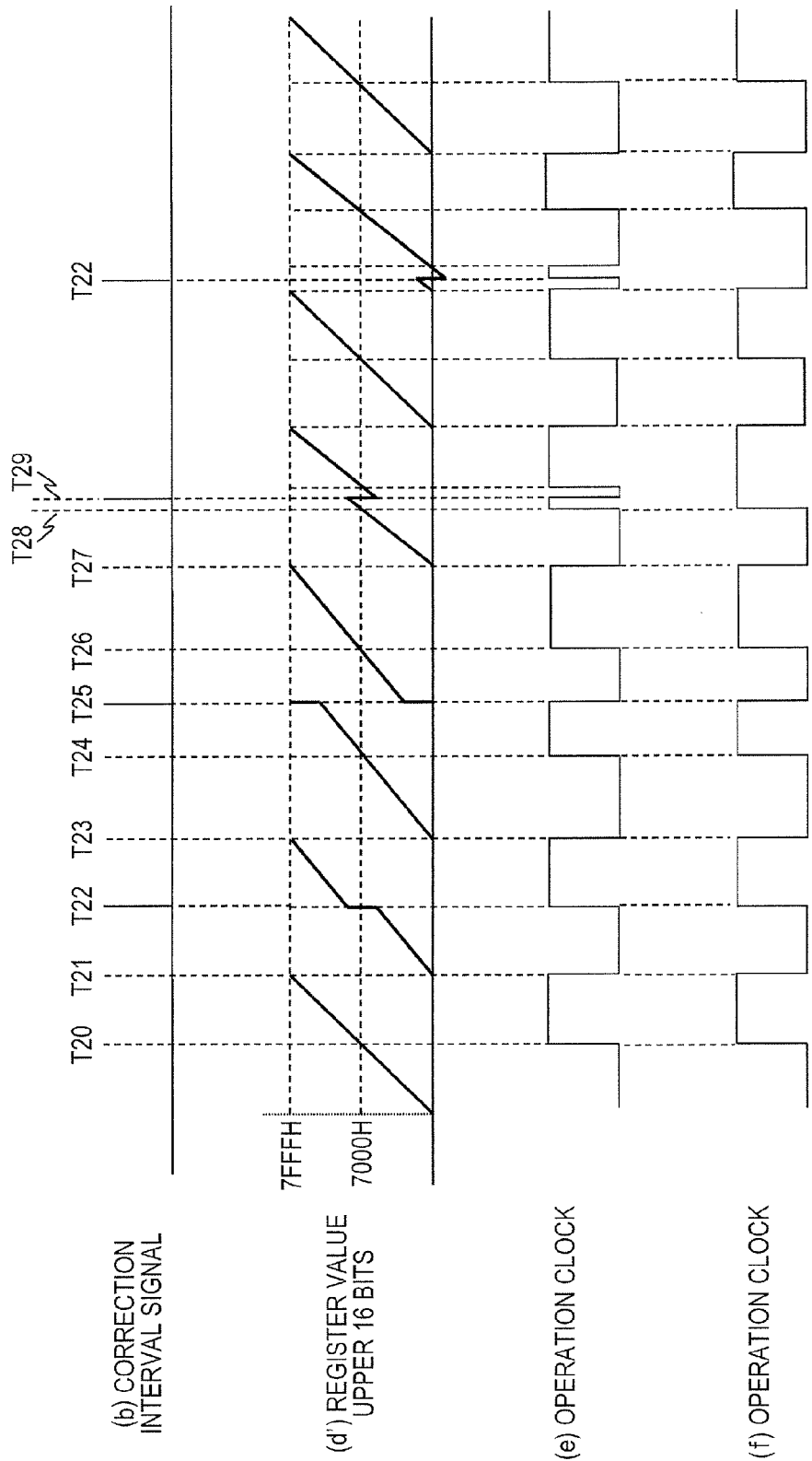
FIG. 8 is a timing chart showing the operation of an operation clock correction circuit according to the first embodiment of the present invention.

Next, the operation of the operation clock correction circuit 115 will be described with reference to FIG. 4 and FIG. 8. FIG. 8 is a timing chart showing the operation of the operation clock correction circuit 115.

As described above, the correction value can be set to either a positive number or a negative number.
Therefore, even if the fundamental clock (a) has positive frequency errors or negative frequency errors, the frequency errors can be corrected (In other words, even if the fundamental clock (a) is higher than the desired frequency or a lower frequency, the frequency error can be corrected). Here, at the time the adder 113 adds a negative value, there is possibility that the second-highest bit of the register value (d) changes (in other words, the operation clock (e) changes) at the timing when the correction interval signal (b) shown in FIG. 8 becomes high-level (at timing T21 or timing T22). This operation unnecessarily increases the frequency of the operation clock (e) and is unintended.

The operation clock correction circuit 115 is a circuit for suppressing this change. As shown in FIG. 4, both operation clock (e) and correction interval signal (b) are input to the operation clock correction circuit 115.

The operation clock correction circuit 115 detects the change of the value of the operation clock (e) at timings T20 to T28. The operation clock correction circuit 115 detects the rechange of the value of the operation clock (e) during the time when the correction interval signal (b) is high-level within the predefined time period from these detections. Here, the predefined time period is a time period of 4 clock pulses of the operation clock (e) (4 is obtained by rounding up the quotient of 100 ppm/30.5 ppm) if the correctable minimum value is −100 ppm, and it is undesirable that the operation clock (e) rechanges during this predefined time period. The operation clock correction circuit 115 detects the rechange of the operation clock (e) during the time period, for example, from T28 to T29. If this rechange is detected, the operation clock correction circuit 115 generates the operation clock (f) that ignores the rechange of the operation clock (e) (at timing T29). As a result, the operation clock (f) that is not affected by the unintended increase of the frequency of the operation clock is generated by the operation clock correction circuit 115.

The operation clock correction circuit 115 can be materialized by a circuit that detects the edges of the correction interval signal (h), counts the predefined time period, and corrects the edge timings of the operation clock (e), so that the operation clock correction circuit 115 can be comprised of an arbitrary combination of existing digital circuits. The operation clock correction circuit 115 supplies the generated operation clock (f) to the correction clock generation circuit 120.

Here, let us refer to FIG. 4 again. The flip-flop 144 supplies a bit value (lower-bit value), which is represented by the bits lower than the predefined bit (the second-highest bit in FIG. 5), and is used for judging the change of the state of the operation clock (e), to the correction clock generation circuit 120 when the state of the operation clock (e) changes (from high-level to low-level or vice versa). In addition, because it has been assumed that the fundamental clock (a) does not generates an error equal to or larger than 1 Hz per second (for example, the frequency of the fundamental clock does not become 32.769 Hz or larger), the absolute value of the value corresponding to the frequency errors of the fundamental clock (a) (an error value) always become smaller than the absolute values of the fixed values B. Therefore, when the state of the operation clock (e) changes (at the edge timings of the operation clock (e)), a bit value represented by every bit lower than the predefined bit (the second-highest bit in FIG. 5) used for judging the change of the state of the operation clock (e) become 0 except for the lower m-bit value (g) (m=5 in FIG. 5) of the register value (d). In other words, at the edge timings of the operation clock (e), the values of the bits other than the lower m-bit value (g) (m=5 in FIG. 5) of the register value (d) can be ignored. As a result, the flip-flop 114 supplies the lower m-bit value (g) (m=5 in FIG. 5) of the register value (d) to the correction clock generation circuit 120.

<Configuration and Operation of Correction Clock Generation Circuit 120>

Figure 9:
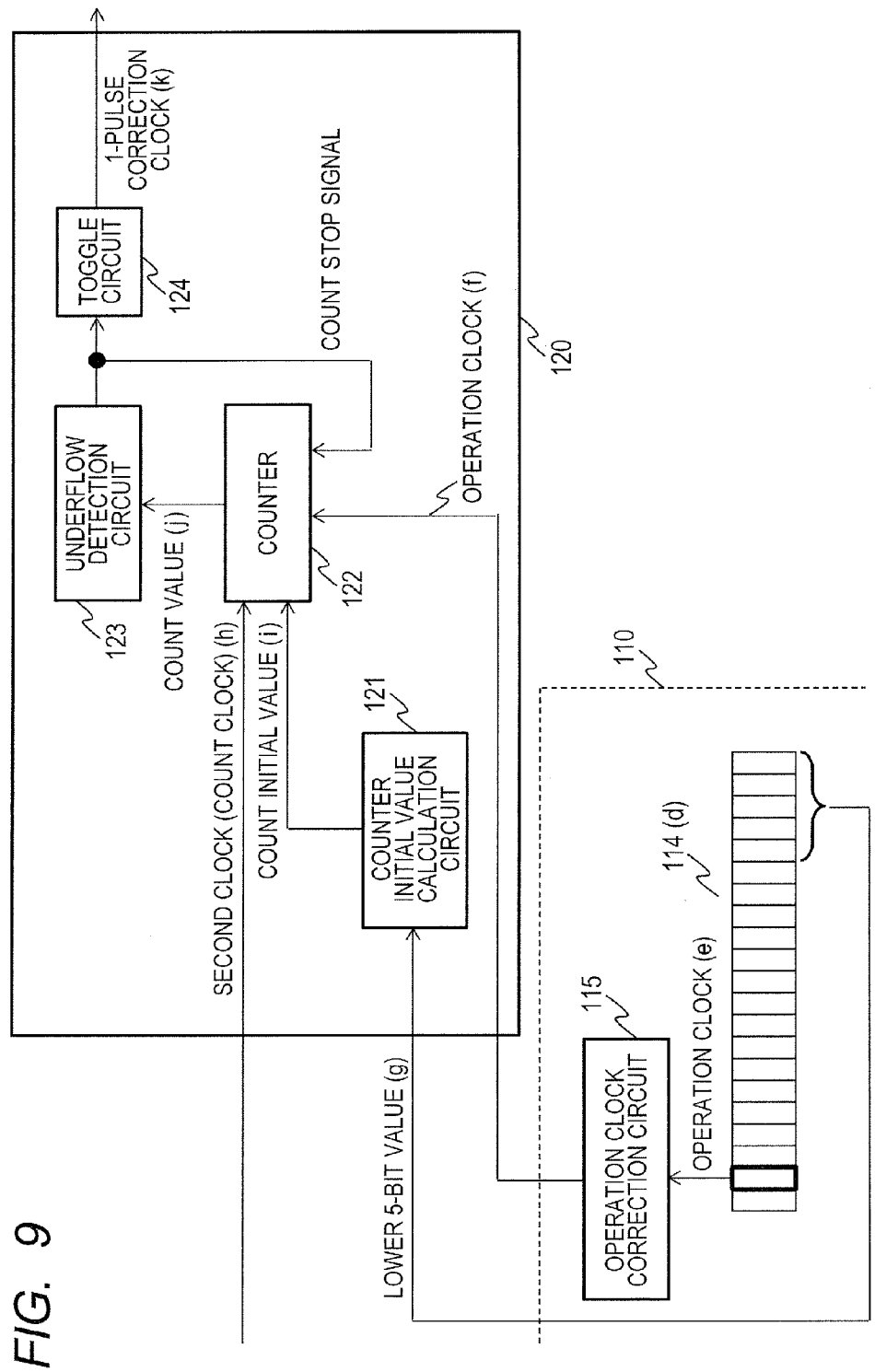
FIG. 9 is a block circuit showing the configuration of a correction clock generation circuit according to the first embodiment of the present invention.

Next, the correction clock generation circuit 120 will be described in detail. FIG. 9 is a block diagram showing the configuration of the correction clock generation circuit 120. The correction clock generation circuit 120 includes a counter initial value calculation circuit 121, a counter 122, an underflow detection circuit 123, and a toggle circuit 124. The lower m-bit value (g) of the register value (d) of the flip-flop 114, the operation clock (f), and the second clock (h) are input to the correction clock generation circuit 120.

The counter initial value calculation circuit 121 calculates a count initial value (i) (initial value of the count number of the clock pulses) that is used for counting performed by the counter 122 on the basis of the lower m-bit value (g), the bit width of the lower m-bit value (g), and the frequency of the second clock (h). The counter initial value calculation circuit 121 is the so-called decoder, and the count initial value (i) is calculated with the use of the following decode equation [Expression 2].

$$\text{Count Initial Value} = \frac{(2^N - 1(n)) \times f_{cnt}}{2^{(15+N)}} \quad \text{[Expression 2]}$$

n: lower-bit value (g)
N: bid width of lower-bit value (g)
fcnt: frequency of second clock The counter initial value calculation circuit 121 supplies the calculated count initial value (i) to the counter 122.

The counter 122 starts counting the clock pulses of the second clock (h) at an edge timing of the operation clock (f), and supplies a values (count value (j)) obtained by subtracting the count number of the clock pulses of the second clock (h) from a count initial value (i) to the underflow detection circuit 123. The counter 122 stop counting when a count stop signal is supplied to the counter 122 by the underflow detection circuit 123.

The underflow detection circuit 123 is a circuit that detects the overflow of the value (count value (j)) supplied from the counter 122. On detecting the underflow of the count value (j), the underflow detection circuit 123 supplies the count stop signal to the counter 122 and the toggle circuit 124.

The toggle circuit 124 generates the 1-pulse correction clock (k) by changing its own state (from high-level to low-level or vice versa) on receiving the count stop signal.

Although the above description has been made on the assumption that the correction clock generation circuit 120 includes the underflow detection circuit 123, this assumption is not always indispensable. For example, it is conceivable that the counter 122 is configured to be a counter that counts up the second clock (h). In this case, it is conceivable that the correction clock generation circuit 120 includes an overflow detection circuit, which detects that the count number of the clock pulses of the second clock (h) counted by the counter 122 exceeds the count initial value (i) (an overflow), instead of the underflow detection circuit 123. On detecting the overflow, the overflow detection circuit supplies the count stop signal to the counter 122 and the toggle circuit 124.

Figure 10:
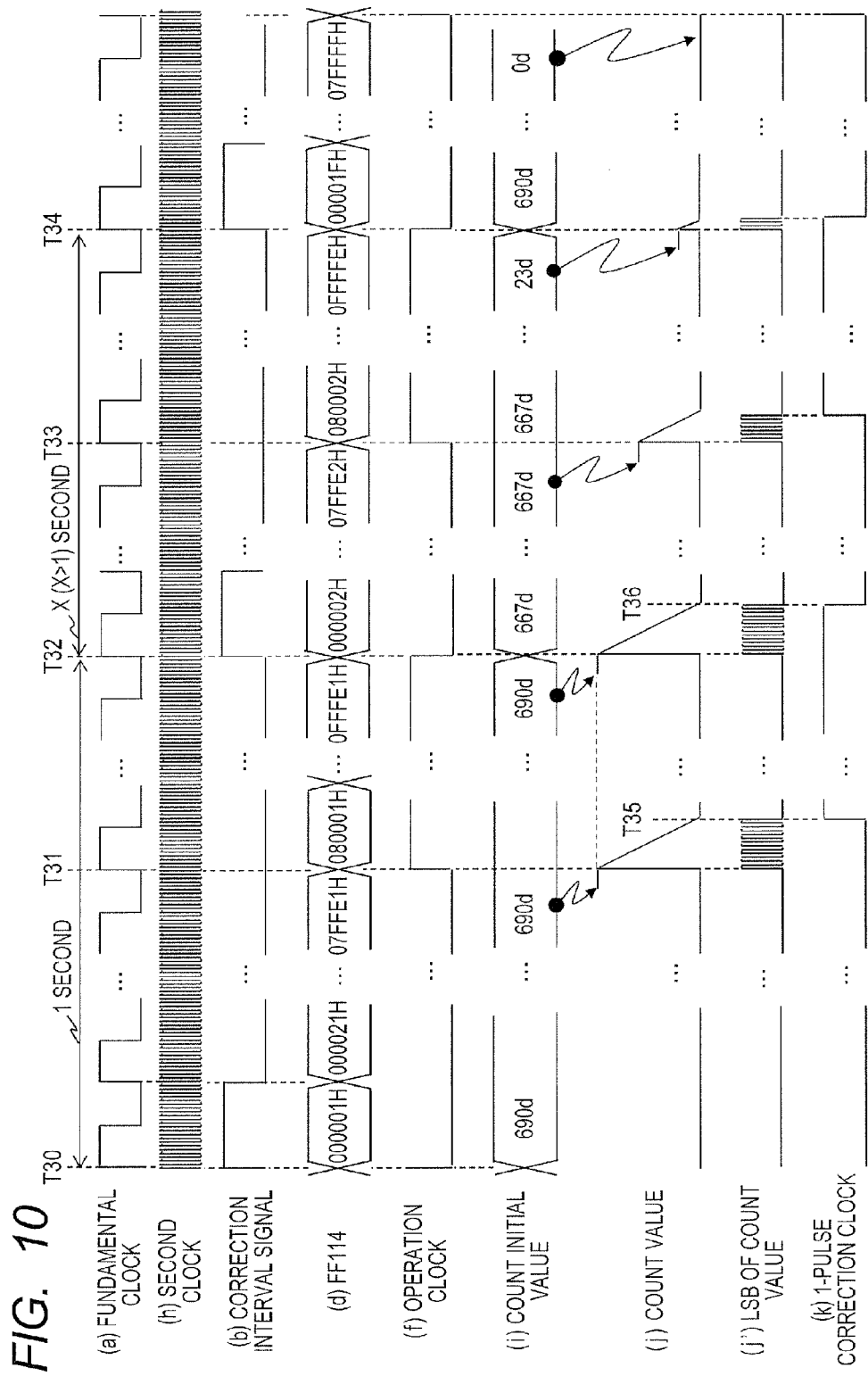
FIG. 10 is a timing chart showing the operation of the clock correction circuit according to the first embodiment of the present invention.

Next, the output signals of various circuits of the correction clock generation circuit 120 will be described with reference to a timing chart in FIG. 10. FIG. 10 is a timing chart showing the operation of the correction clock generation circuit 120 in the case where the fundamental clock (a) has positive frequency errors. In addition, two signals in the operation clock generation circuit 110 (to be concrete, the correction interval signal (b) and the register value (d) of the flip-flop 114) are also displayed in FIG. 10 for convenience of explanation. In addition, numeric values in this timing chart are represented in hexadecimal, and the correction value is always set to "000021H" for convenience of explanation in FIG. 10.

When the correction interval signal (b) is low-level, the fixed value B (000020H in FIG. 10) is added to the register value (d) in response to the rising edge of the fundamental clock (a). When the correction interval signal (b) is high-level, the correction value (000021H in FIG. 10) is added to the register value (d) in response to the rising edge of the fundamental clock (a). The correction interval signal (b) becomes high-level once per second (that is, a one-shot pulse generated once per second). Therefore, the lower m(=5)-bit value (g) of the register value (d) changes once per second.

For example, at timing T30, the correction interval signal (b) becomes high-level. Therefore, the lower m(=5)-bit value (g) of the register value (d) changes at timing T30 (the lowest bit changes because the numeric values are displayed in hexadecimal in FIG. 10). In the same manner as at timing T30, the correction interval signal (b) becomes high-level at timing T32, and the lower m(=5)-bit value (g) of the register value (d) changes at timing T32 (the lowest bit changes because the numeric values are displayed in hexadecimal in FIG. 10).

The counter initial value calculation circuit 121 calculates the count initial value (i) on the basis of the lower m(=5)-bit value (g) of the register value (d) and the frequency of the second clock (h). For example, the counter initial value calculation circuit 121 calculates a count initial value (i) "690d" at timing T30.

The counter 122 starts count processing at the edge timings (timings T31, T32, and the like) of the operation clock (f). Here, the counter 122 calculates the count value (j) by subtracting the count number of the clock pulses of the second clock (h) from the count initial value (i). On detecting the underflow of the count value (j), that is, as soon as the underflow occurs, the underflow detection circuit 123 outputs the count stop signal. The waveform of the LSB (j') of the count value becomes the same as that of the second clock (h) during the time between the count start to the count stop. The 1-pulse correction clock (k) changes its value in response to the output of the count stop signal.

For example, the underflow detection circuit 123 detects the underflow at timing T35, and outputs the count stop signal. In response to the count stop signal, the 1-pulse correction clock (k) changes its value at timing T35. In the same manner as at timing T35, because the underflow occurs at timing T36, the 1-pulse correction clock (k) changes its value at timing T36.

The counter initial value calculation circuit 121 calculates the count initial value (i) at each timing. The counter 122 starts count processing at timings T33, T34, etc. (at the edge timings of the operation clock (f)). Because the count initial value (i) changes in accordance with the addition of the correction value at the time of the input of the correction interval signal (b), a time period during which the clock pulses of the second clock (h) is counted also changes. As described above, the pulse width of the 1-pulse correction clock (k) is adjusted in accordance with the lower m(=5)-bit value (g) of the register value (d) (that is, in accordance with the value corresponding to the frequency error that is not reflected in the operation clock (f)).

Figure 11:
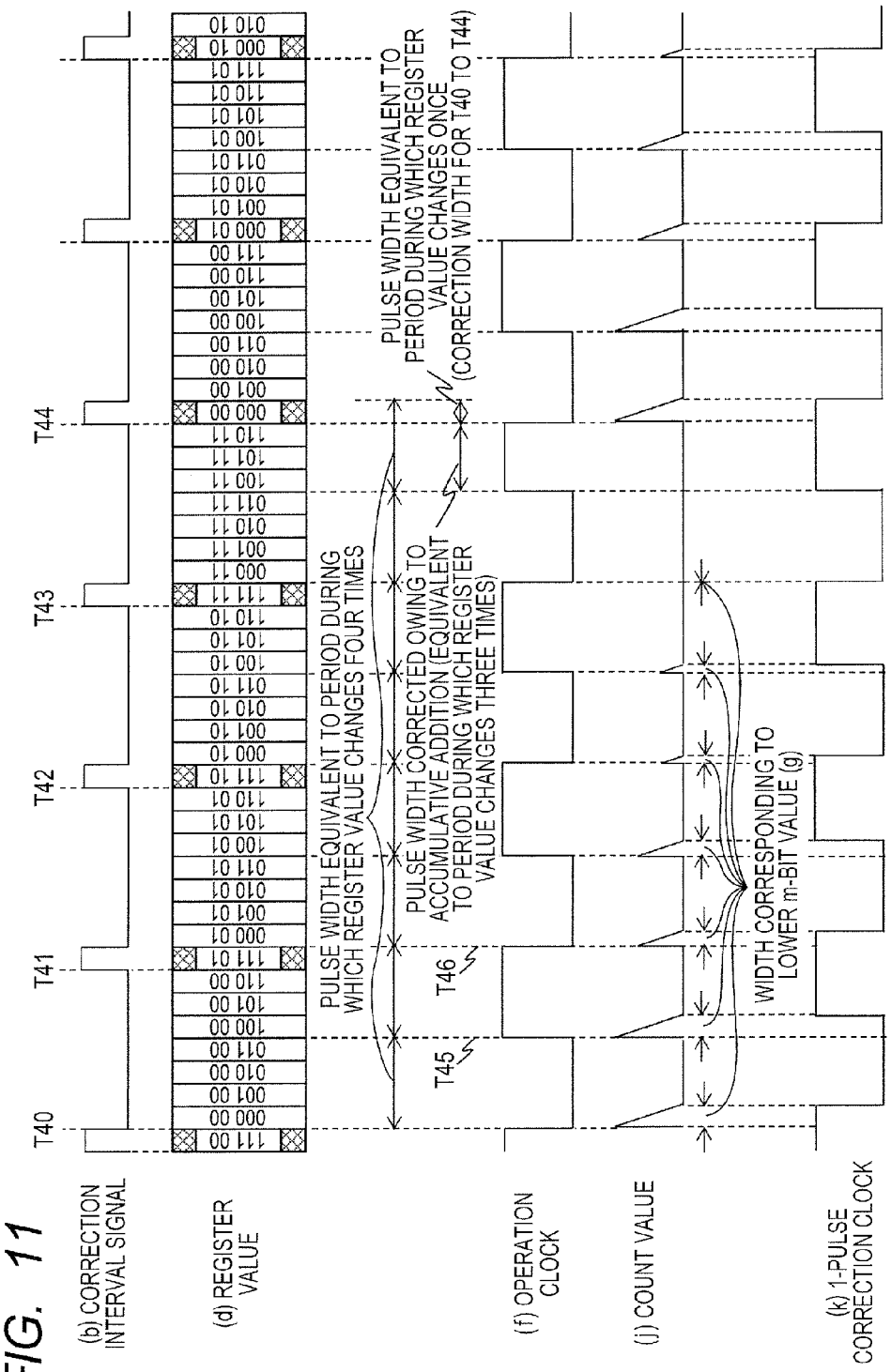
FIG. 11 is a timing chart showing the operation of the clock correction circuit according to the first embodiment of the present invention.

FIG. 11 is a diagram schematically showing the timing chart of FIG. 10. In FIG. 11, for ease of understanding, it will be assumed that the register value (d) is a 5-bit value and the lower m-bit value is a 2-bit value. In addition, let us assume that the register value (d) is not represented in a complement format. In addition, let us assume that the fixed value B is "00100" and that the operation clock (f) changes its state when the value of the highest bit of the register value (d) changes. In addition, the correction value is always set to "00101" in FIG. 11.

The correction value "00101" is added to the register value (d), when the correction interval signal (b) becomes high-level (at timings T41, T42, T43, and T44). In other words, "01" is accumulatively added to the lower m(=2)-bit value (g) when the correction interval signal (b) becomes high-level (at timings T41, T42, T43, and T44).

In this embodiment, the accumulative addition value of the lower m(=2)-bit value (g) of the register value (d) does not produce a carry to the third-lowest bit until timing T44. Therefore, the operation clock (f) changes its value every four updates of the register value (d) until timing T44.

At timing T44, the accumulative addition value of the lower m(=2)-bit value (g) produces a carry to the third-lowest bit. Therefore, the value of the highest bit changes its value at the timing (T44) of the third update of the register value (d) since the latest change of the highest bit. As a result, the correction of the operation clock (f) is performed at timing T44. In other words, the operation clock (f), on which the correction of the frequency errors having occurred from timing T40 to timing T44 is performed in a lot at timing T44, is generated.

On the other hand, the 1-pulse correction clock (k) start counting in accordance with the lower m(=2)-bit value (g) at an edge timing of the operation clock (f). When the counting is finished, the value of the 1-pulse correction clock (k) is updated. For example, the 1-pulse correction clock (k) start counting at timing T45, that is, an edge timing of the operation clock (f), in accordance with the lower 2-bit value "00", and the value of the 1-pulse correction clock (k) changes when the counting is finished. In addition, the 1-pulse correction clock (k) start counting at timing T46, that is, an edge timing of the operation clock (f), in accordance with the lower 2-bit value "01", and the value of the 1-pulse correction clock (k) changes its value when the counting is finished.

As described above, the 1-pulse correction clock (k) has various pulse widths adjusted in accordance with the lower m(=2)-bit value (g) of the register value (d). In other words, while the operation clock (f) is a clock on which the correction of the errors having occurred from timing T40 to timing T44 is performed, the 1-pulse correction clock (k) is a clock that is generated in a way its pulse width is adjusted with the use of the lower m(=2)-bit value that shows the frequency errors that are not reflected in the generation of the operation clock (f). Therefore, the 1-pulse correction clock (k) becomes a clock signal in each pulse of which the frequency errors of the fundamental clock (a) is reflected.

Figure 12:
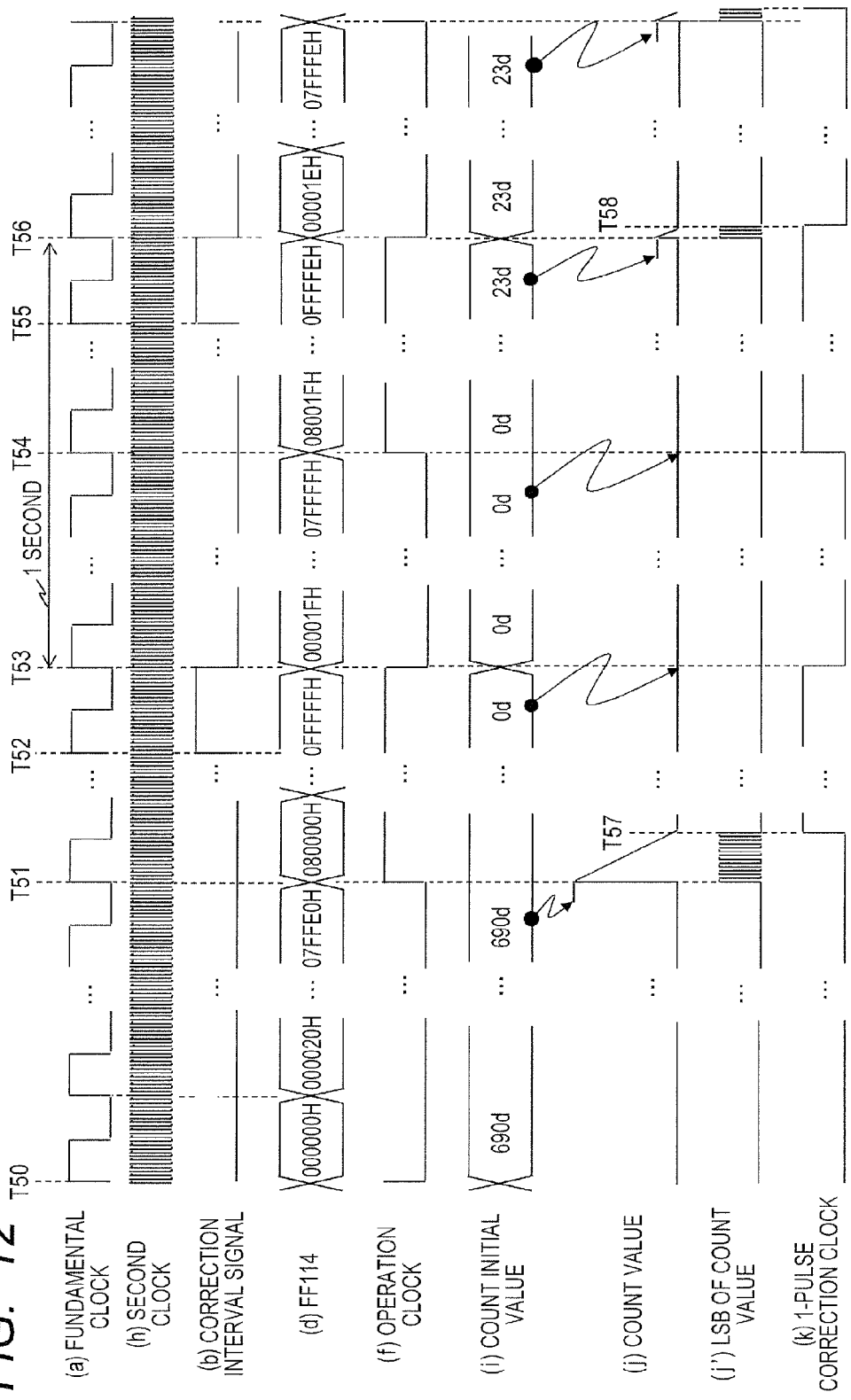
FIG. 12 is a timing chart showing the operation of the clock correction circuit according to the first embodiment of the present invention.

Next, the case where the fundamental clock (a) has negative frequency errors will be explained. FIG. 12 is a timing chart showing the operation of the correction clock generation circuit 120 in the case where the fundamental clock (a) has negative frequency errors. The operation of each circuit in the correction clock generation circuit 120 is the same as that in the case where the fundamental clock (a) has positive frequency errors (shown in FIG. 10). It will be assumed that the fixed value B is "000020H", and the correction value is "00001FH".

When the correction interval signal (b) is low-level, the fixed value B (000020H in FIG. 12) is added to the register value (d) in response to the count of the fundamental clock (a). When the correction interval signal (b) is high-level, the correction value (00001FH in FIG. 12) is added to the register value (d) in response to the count of the fundamental clock. For example, the lower m(=5)-bit value (g) of the register value (d) changes at timings T52 and T55 (The lowest bit changes because the numeric values are displayed in hexadecimal in FIG. 12).

The counter initial value calculation circuit 121 calculates the count initial value (i) on the basis of the lower m(=5)-bit value (g) and the frequency of the second clock (h). For example, the counter initial value calculation circuit 121 calculates a count initial value (i) of "690d" at timing T50 and a count initial value (i) of "0d" at timing T53.

The counter 122 starts count processing at the edge timings (timings T31, T32, and the like) of the operation clock (f). On detecting the underflow of the count value (j) of the counter 122, the underflow detection circuit 123 outputs the count stop signal. For example, the underflow detection circuit 123 detects the underflow at timing T57. In the same manner, the underflow detection circuit 123 detects the underflow at timings T53, T54, and T58, and outputs the count stop signal. In addition, because the count initial value (i) is "0d" at timing T53, the edge timing of the operation clock (f) and the underflow are detected at the same time.

The 1-pulse correction clock (k) changes its value at timings T57, T53, T54, and T58 in response to the output of the count stop signal.

Figure 13:
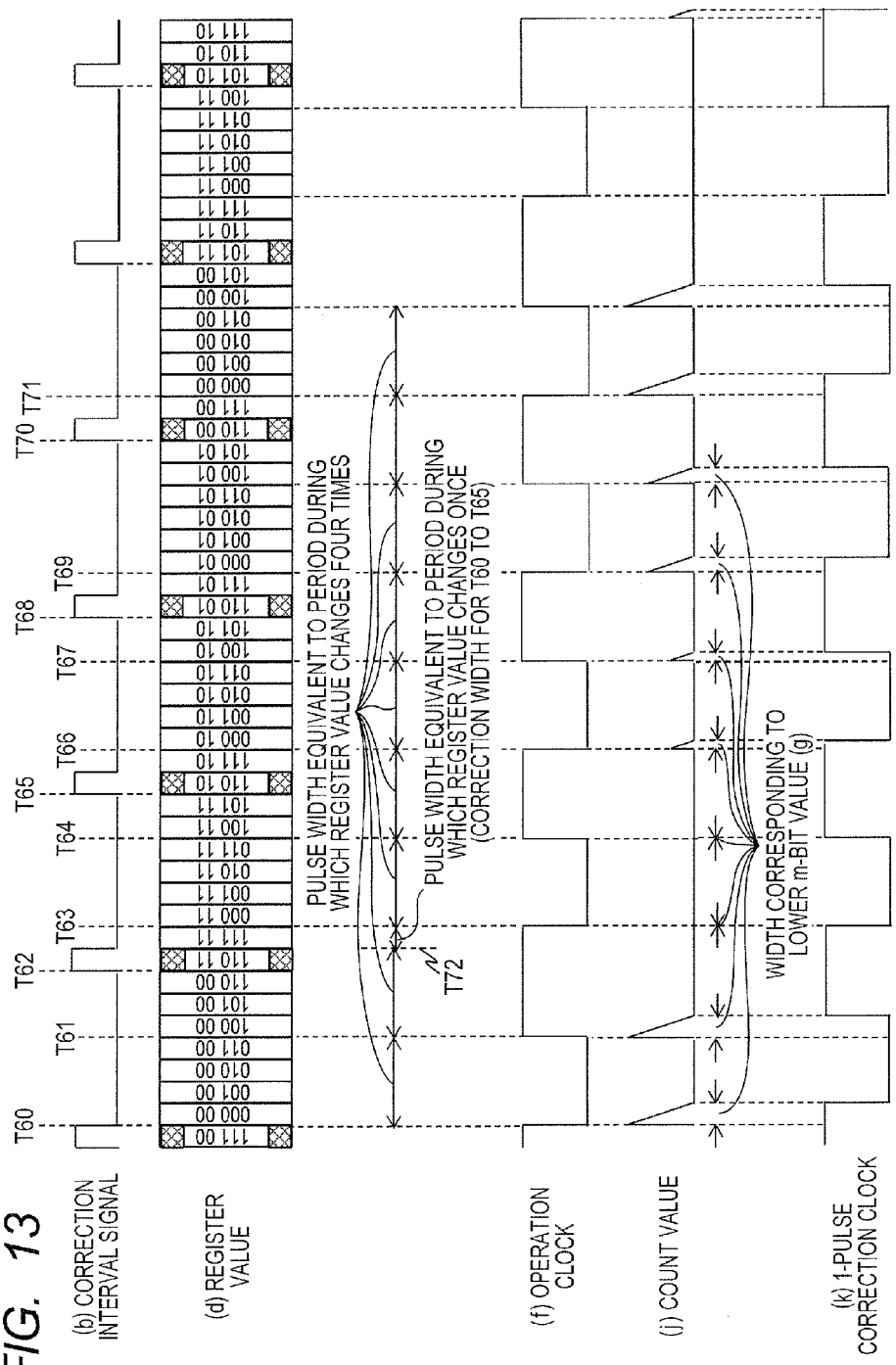
FIG. 13 is a timing chart showing the operation of the clock correction circuit according to the first embodiment of the present invention.

FIG. 13 is a diagram schematically showing the timing chart of FIG. 12 (in the case where the fundamental clock (a) has negative frequency errors). In FIG. 13, as is the case with in FIG. 11, for ease of understanding, it will be assumed that the register value (d) is a 5-bit value and the lower m-bit value is a 2-bit value. In addition, let us assume that the register value (d) is not represented in a complement format. In addition, let us assume that the fixed value B is "00100" and that the operation clock (f) changes when the highest bit changes. In addition, the correction value is always set to "00101" in FIG. 13.

The correction value "00011" is added to the register value (d), when the correction interval signal (b) becomes high-level (at timings T62, T65, T68, and T70). In other words, "11" is accumulatively added to the lower m(=2)-bit value (g) when the correction interval signal (b) becomes high-level (at timings T62, T65, T68, and T70).

In FIG. 13, the fixed value B "00100" is larger than the correction value "00011". Therefore, even if the correction value "00011" is added to the register value (d) at timing T62, the highest bit of the register value (d) does not change. As a result, the operation clock (f) does not change at timing T72, but changes its state at timing T63. In other words, the state of the operation clock (f) changes at timing T63 at which the fifth update of the register value (d) is performed since timing T51. The state of the operation clock (f) changes every four updates of the register value (d) (during timings T60 to T61, T63 to T64, T64 to T66, T66 to T67, and T67 to T69) except for during timings T61 to T63.

The value of the operation clock (f) does not change at timing T72, but changes at timing T63, which makes the operation clock (f) a clock signal on which the correction of the frequency errors having occurred from timing T60 to timing T71 is performed. In other words, the operation clock (f) is adjusted by performing the correction of the frequency errors in a lot at timing T63.

On the other hand, the value of the 1-pulse correction clock (k) is updated when counting, which has been started at an edge timing of the operation clock (f) in accordance with the lower m(=2)-bit value (g), is finished. For example, counting is started at an edge timing of the operation clock (f), that is, at timing T61 in accordance with the lower 2-bit value "00", and the state of the 1-pulse correction clock (k) changes its state when the counting is finished. In a similar way, counting is started at an edge timing of the operation clock (f), that is, at timing T63 in accordance with the lower 2-bit value "11", and the state of the 1-pulse correction clock (k) changes its state when the counting is finished.

In the same way as explained with reference to FIG. 11, the 1-pulse correction clock (k) becomes a clock signal in each pulse of which the frequency errors of the fundamental clock (a) are reflected.

Although the description about FIG. 10 to FIG. 13 has been made on the assumption that the correction value is a constant value, this assumption is not always necessary. The correction value can be adequately changed with time in accordance with the calculation with the use of temperature characteristics. The temperature characteristics will be described later. The count initial value (i) is determined in accordance with the change of this correction value. For example, when the correction value becomes "000020H" (equal to the fixed value B), the count initial value (i) does not change, so that the count stop signal is output at the timing when counts of the same number as the number of counts in the previous counting are finished. On the other hand, in the case where the correction value is largely changed at a timing, the count initial value (i) largely changes from the last count initial value (i), so that the time spent for the counting largely changes.

<Function of Clock Correction Circuit 100>

Next, the function of the clock correction circuit 100 will be described. The operation clock generation circuit 110 outputs the operation clock on which the correction of the frequency errors having occurred during a certain time period is performed. To be exact, the operation clock generation reflects a value corresponding to the frequency errors of the fundamental clock (a) (the first clock), that is, an error value, in the accumulated value of fixed values adds an error value, that is, a value corresponding to the frequency errors of the fundamental clock (a) to the accumulated value of fixed values) at a predefined timing. In addition, the operation clock generation circuit 110 performs a correction in a lot at the timing when the value of the predefined bit of the accumulated value (the second-highest bit in FIG. 5) changes, which makes it possible that the operation clock on which the correction of the frequency errors having occurred during a certain time period is performed is output. In the above description, the values of the frequency errors whose resolutions are less than 30.5 ppm are accumulated as the lower m-bit value (g). Stated another way, at each edge timing of the operation clock, the frequency error that is not reflected in the change of the state of the operation clock are accumulatively stored in the lower m-bit value (g). In other words, a lower-bit value that is a value represented by the bits lower than the predefined bit remains in the accumulated value at the timing of the change of the state of the operation clock (that is, at the edge timing). This remaining bit value (lower-bit value) is a bit value that can not directly be dealt with in the judgment of the target edge timing of the operation clock.

The correction clock generation circuit 120 converts the lower m-bit value (g) that remains in this accumulated value into the count number of the clock pulses of the second clock whose frequency is higher than that of the operation clock (a) (to be exact, the frequency of the second clock is a frequency that satisfies an equation (a required output frequency/a desired resolution)). Successively, the correction clock generation circuit 120 generates a correction clock whose edges are shifted from the corresponding edge timings of the operation clock in accordance with the corresponding count number (In other words, the correction clock generation circuit 120 generates a 1-pulse correction clock (k)). When the operation clock (f) changes its state, the pulse widths of the operation clock (f) are corrected with the use of the bit values remaining in the accumulated value, therefore a highly accurate clock signal can be generated.

This embodiment will be described from another viewpoint. The register value (d) (accumulated value) of the flip-flop 114 is a value obtained by reflecting the frequency errors of the fundamental clock (a) in a value obtained by accumulating fixed values determined on the basis of the required frequency of the output signal. In other words, the register value (d) (accumulated value) is a value in which both the required frequency and the frequency errors of the fundamental clock (a), which is the generation source of the required frequency, are reflected. Therefore, all the bits (all the digits) of the register value (d) (accumulated value) are used, so that an accurate correction signal can be calculated. The correction clock generation circuit 120 corrects the operation clock with the use of a value to which the operation clock generation circuit 110 gives importance and which is represented by the bits lower than the predefined bit (the predefined bit shown in FIG. 5 is the second-highest bit). In the above example, the value represented by the bits lower than the predefined bit is the lower m-bit value (g) of the register value (d) (accumulated value). Owing to this correction made by the correction clock generation circuit 120, the accurate correction signal can be generated.

Although the count processing has been performed at every edge timing of the operation clock, this is not always indispensable. For example, it is conceivable that the correction clock generation circuit 120 performs the above count processing at falling edge timings of the operation clock (f). Even in this case, an accurate clock signal, on which the correction of the frequency errors is performed at intervals shorter than the correction intervals of the operation clock (f), can be generated. In a similar manner, it is also conceivable that the above count processing is performed every several edge timings (for example, every three edge timings) of the operation clock (f). In other words, if the correction clock generation circuit 120 performs the correction (count processing) at intervals (second intervals) shorter than the correction intervals (first intervals) of the operation clock (f), a satisfactory clock signal can be obtained.

In addition, the correction value and the register value (d) can be represented by in a complement format. Because the correction value can be represented in the complement format, it becomes possible that the register value (d) can be not only incremented but also decremented. This makes it possible that both cases where the fundamental clock has a positive frequency error and a negative frequency error can be dealt with, where both frequency errors are represented in units of ppm.

In addition, the above-described operation clock correction circuit 115 corrects the unintended operation of the operation clock caused by the complement format representation of the correction value and the register value (d) at the output timings of the correction interval signal (b). This makes it possible that the accurate operation clock (f) is generated.

As described above, the second clock (h) is a clock signal that has a frequency equal to the equation (the required output frequency/the desired resolution) or higher. This assures the correction in accordance with the required accuracy to the 1-pulse correction clock (k).

In addition, in this embodiment, the error value (a value obtained by subtracting the fixed value B from the correction value, that is, a value corresponding to the frequency error of the fundamental clock (a)) is smaller than the fixed values B. Therefore, the remaining value in the accumulated value at an edge timing of the operation clock (lower-bit value) is always represented within the lower m-bit value (g). Therefore, the operation clock generation circuit 110 has only to supply the lower m-bit value (g) as the remaining value in the accumulated value at the time of the change of the state of the operation clock to the correction clock generation circuit 120. The bit width used for counting the pulses of the second clock becoming small enables the maximum count number of the counter 122 to be small.

In addition, in the above embodiment, the fixed value B has only in a certain bit (in FIG. 5, the certain bit is the sixth-lower bit), this is not always indispensable. For example, it is conceivable that the fixed value B has "1" in two bits. Even in this case, the correction clock generation circuit 120 has only to generate a correction clock with the use of a bit value represented by the bits lower than the predefined bit in the accumulated value at an edge timing of the operation clock (at the time when the state of the operation clock changes).

<Configuration of MCU 10>

Next, the concrete configuration example of the clock correction circuit 100 shown in FIG. 3 will be described. As methods for calculating the correction value to be input to the operation clock generation circuit 110, there are, for example, three above-mentioned methods. These are: (1) a method using a temperature characteristic table; (2) a method using a temperature characteristic calculation equation; and (3) method using a frequency error detector. A configuration example of the clock correction circuit 100 that employs each of the above methods (that is, a concrete configuration example of the clock correction circuit shown in FIG. 3) will be described with reference to the corresponding drawing.

<Detailed Configuration Example 1 of MCU 10>

Figure 14:
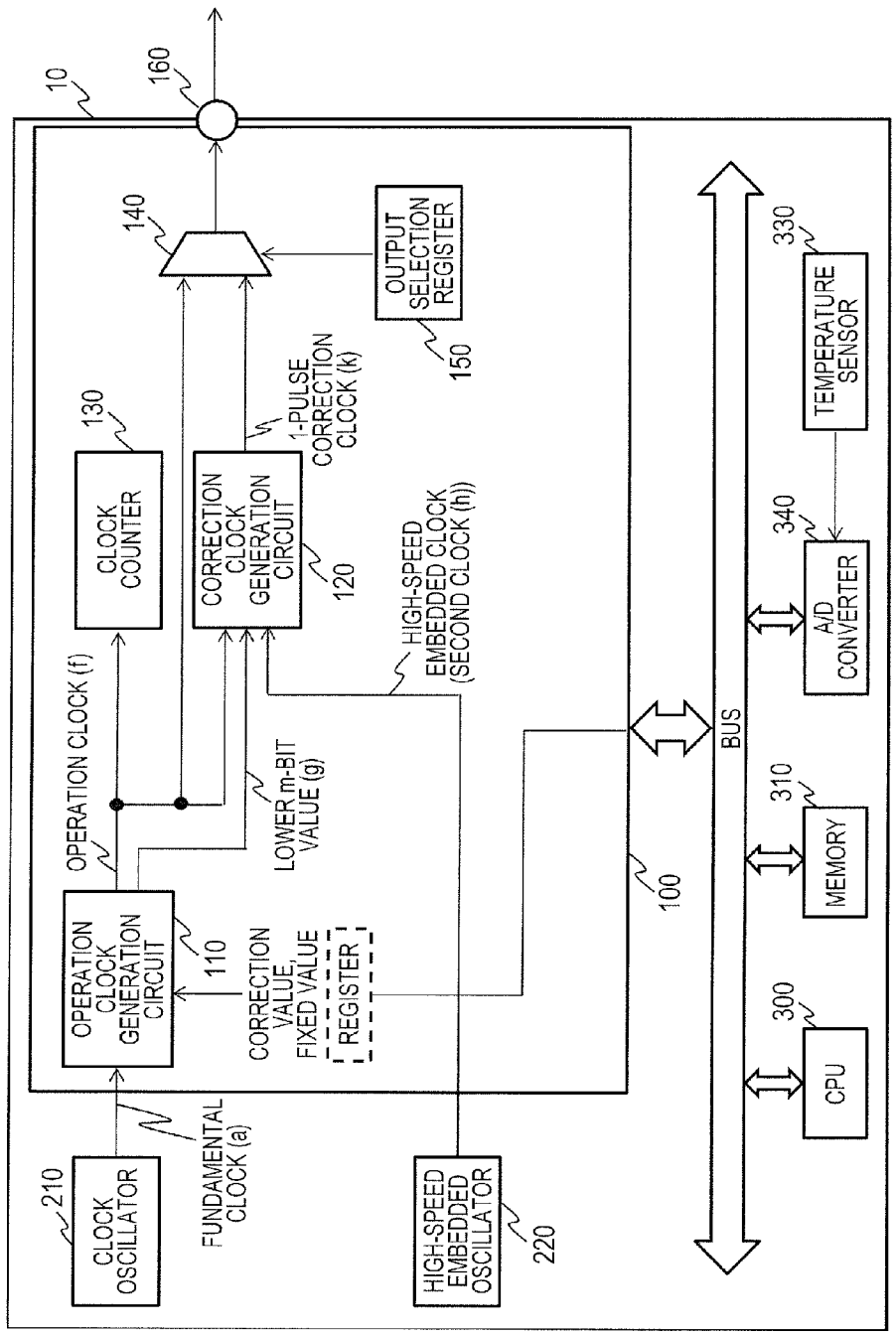
FIG. 14 is a block diagram showing one configuration example of the MCU including the clock correction circuit according to the first embodiment of the present invention.

FIG. 14 is a block diagram showing configurations of the clock correction circuit 100 and the MCU 10 that calculate the correction value to be supplied to the operation clock generation circuit 110 with the use of the temperature characteristic ((1) the temperature characteristic table or (2) the temperature characteristic calculation equation).

Figure 3:
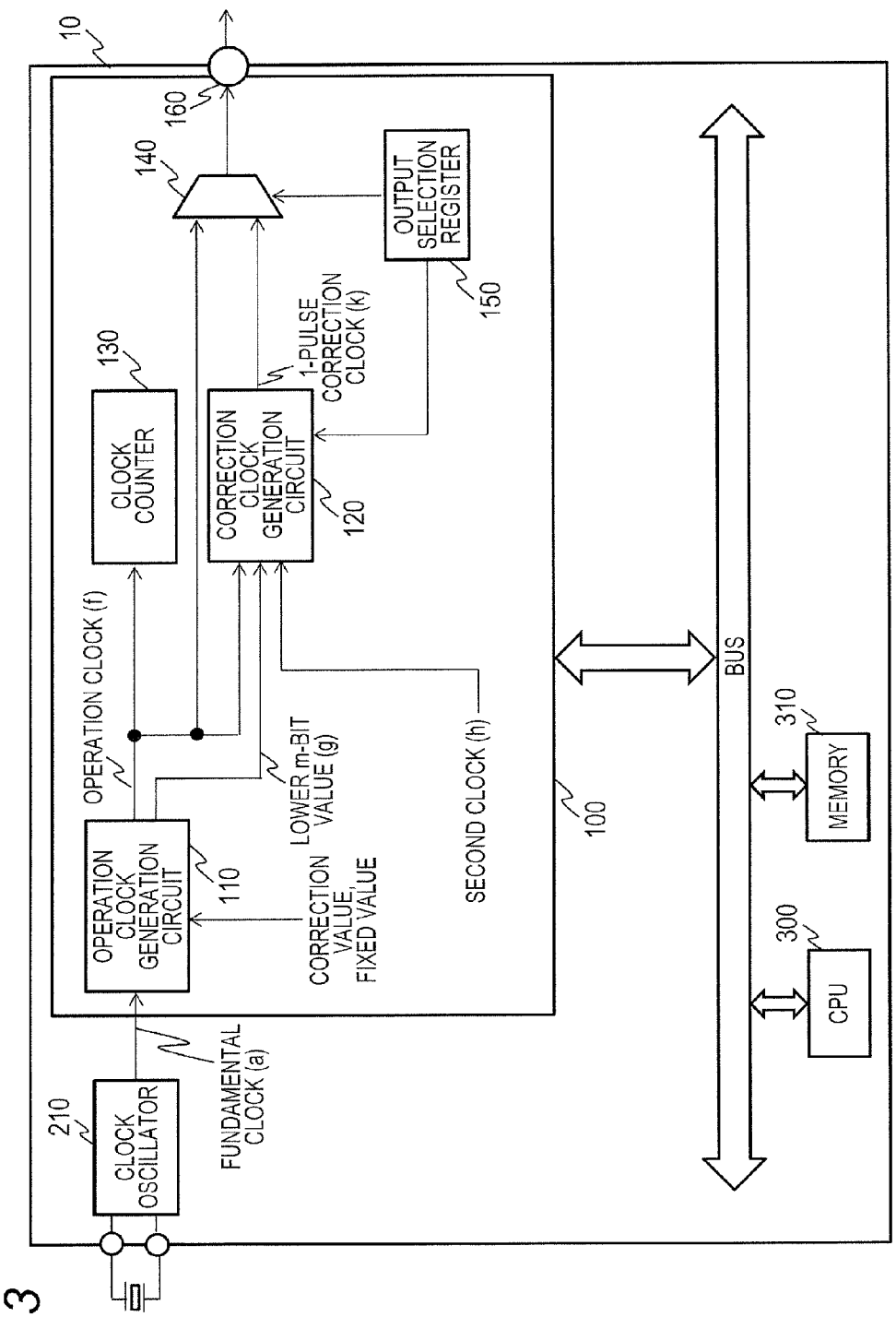
FIG. 3 is a block diagram showing the configuration of an MCU including the clock correction circuit according to the first embodiment of the present invention.

The MCU 10 includes a high-speed embedded oscillator 220, a temperature sensor 330, and an A/D converter 340 as well as the components shown in FIG. 3. In addition, it is conceivable that the clock correction circuit 100 includes a register in which the correction value is set.

The temperature sensor 330 is a common temperature sensor mounted on the MCU 10 for detecting external temperature. The temperature sensor 330 periodically detects temperature, and supplies the detected value (an analog value) to the A/D converter 340. The A/D (Analog/Digital) converter 340 converts the supplied analog value into a digital value, and supplies the digital value to the CPU 300. The temperature sensor 330 and the A/D converter 340 can have any configurations as long as they can be used on a common micro controller.

The CPU 300 calculates the correction value with the use of the temperature characteristic ((1) the temperature characteristic table, or (2) the temperature characteristic calculation equation). The calculation method using the temperature characteristic (1) will be described first. It is well known that the frequency vs. temperature characteristic of a tuning fork type crystal oscillator is represented by a quadratic function that has a negative quadratic coefficient with 25° C. as the center temperature. In this case, a frequency error is uniquely determined if a temperature is determined. The memory 310 stores table information in which temperatures and frequency errors of the fundamental clock (a) are stored in a way that the temperatures and the frequency errors are associated with each other. The CPU 300 reads out a frequency error corresponding to a temperature supplied by the A/D converter 340 via a bus. Successively, the CPU 300 substitutes the frequency error of the fundamental clock (a) read out from the table into the above-described [Equation 1] to calculate a correction value, and supplies the calculated correction value to the operation clock generation circuit 110.

In the case of calculating the correction value using the temperature characteristic calculation equation (2), the CPU 300 reads out the temperature characteristic equation from the memory 310. The temperature characteristic equation shows a quadratic curve as mentioned above. The CPU 300 calculates the frequency error of the fundamental clock (a) by substituting the detected temperature into the temperature characteristic equation. The CPU 300 supplies the calculated correction value to the operation clock generation circuit 110.

For more detail on the frequency vs. temperature characteristic of the fork type crystal oscillator, refer to "URL: http://www.sii.co.jp/components/quartz/ocdpJP.jsp" on the Internet (available on Jun. 1, 2012) and "URL: http://www.tamadenvice.co.jp/32768-temp.htm" on the Internet (available on Jun. 1, 2012). In addition, it is also conceivable that a user sets the correction value in a register which the operation clock generation circuit 110 can access on the basis of the calculated frequency error without the CPU 300 directly supplying the calculated correction value to the operation clock generation circuit 110.

The high-speed embedded oscillator 220 is a common oscillator mounted on the MCU 10. The high-speed embedded oscillator 220 generates a high-speed clock whose frequency is higher than that of the fundamental clock(a). This high-speed clock has a frequency that satisfies the above-described equation (the output frequency of the 1-pulse correction clock/the desired resolution). The high-speed embedded oscillator 220 supplies the generated high-speed clock to the correction clock generation circuit 120 as the second clock (h).

<Detailed Configuration Example 2 of MCU 10>

Figure 15:
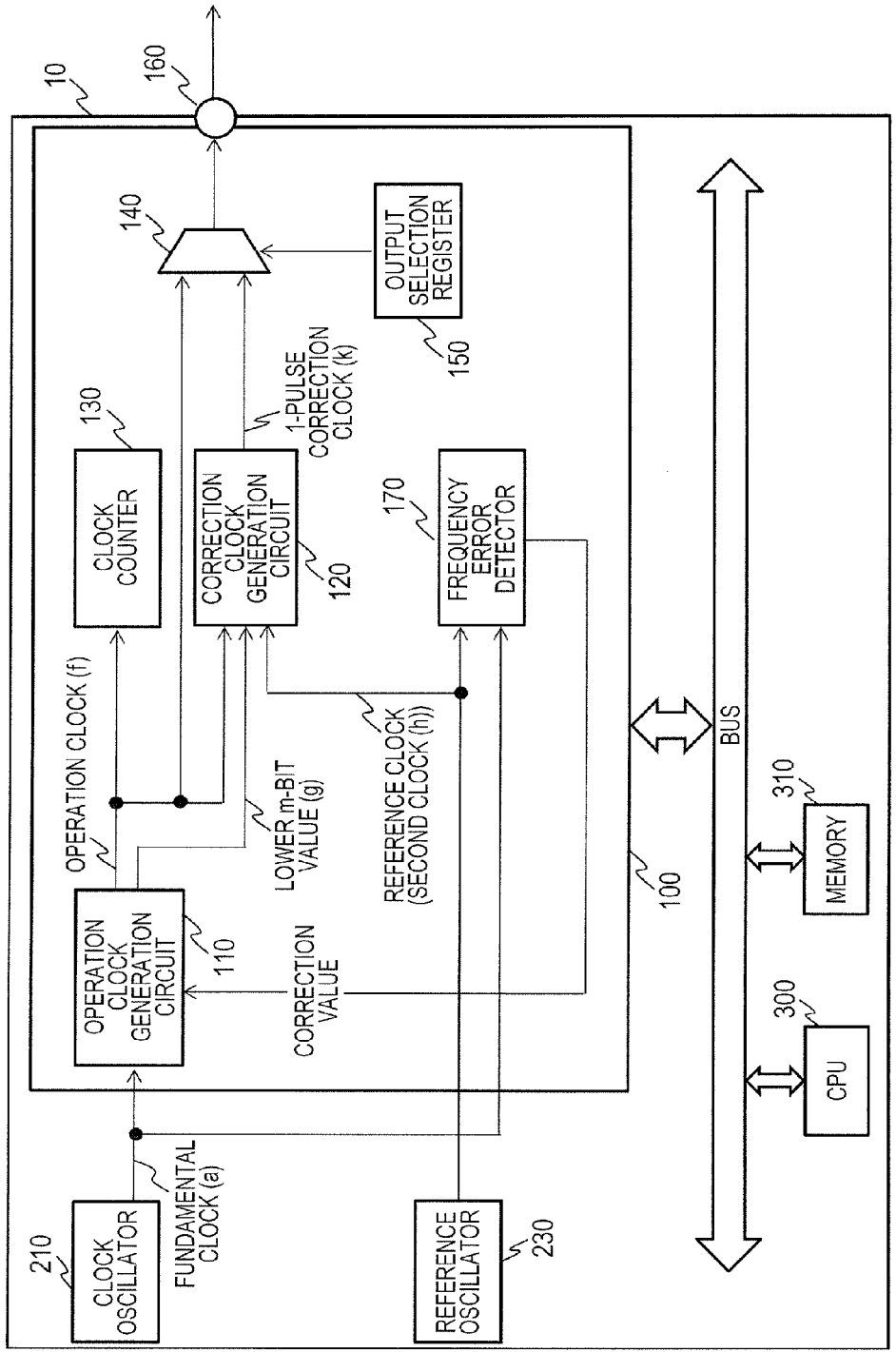
FIG. 15 is a block diagram showing another configuration example of the MCU including the clock correction circuit according to the first embodiment of the present invention.

FIG. 15 is a block diagram showing configurations of the clock correction circuit 100 and the MCU 10 that calculate the correction value to be supplied to the operation clock generation circuit 110 with the use of the frequency error detector (3).

The MCU 10 is configured with a reference oscillator 230. The reference oscillator 230 generates a reference frequency higher than the frequency of the fundamental clock (a) with the use of a TCXO or the like. The frequency of the reference clock oscillator is, for example, 14.4 MHz or 24 MHz. The reference oscillator 230 supplies the generated reference clock to the frequency error detector 170 and the correction clock generation circuit 120 as the second clock (h). Here, although the reference clock 230 can generate a clock signal more accurate than the above-mentioned high-speed clock (the output clock signal generated by the high-speed embedded oscillator 220) clock signal, the reference oscillator 230 consumes more electric power for generating the reference clock.

Figure 16:
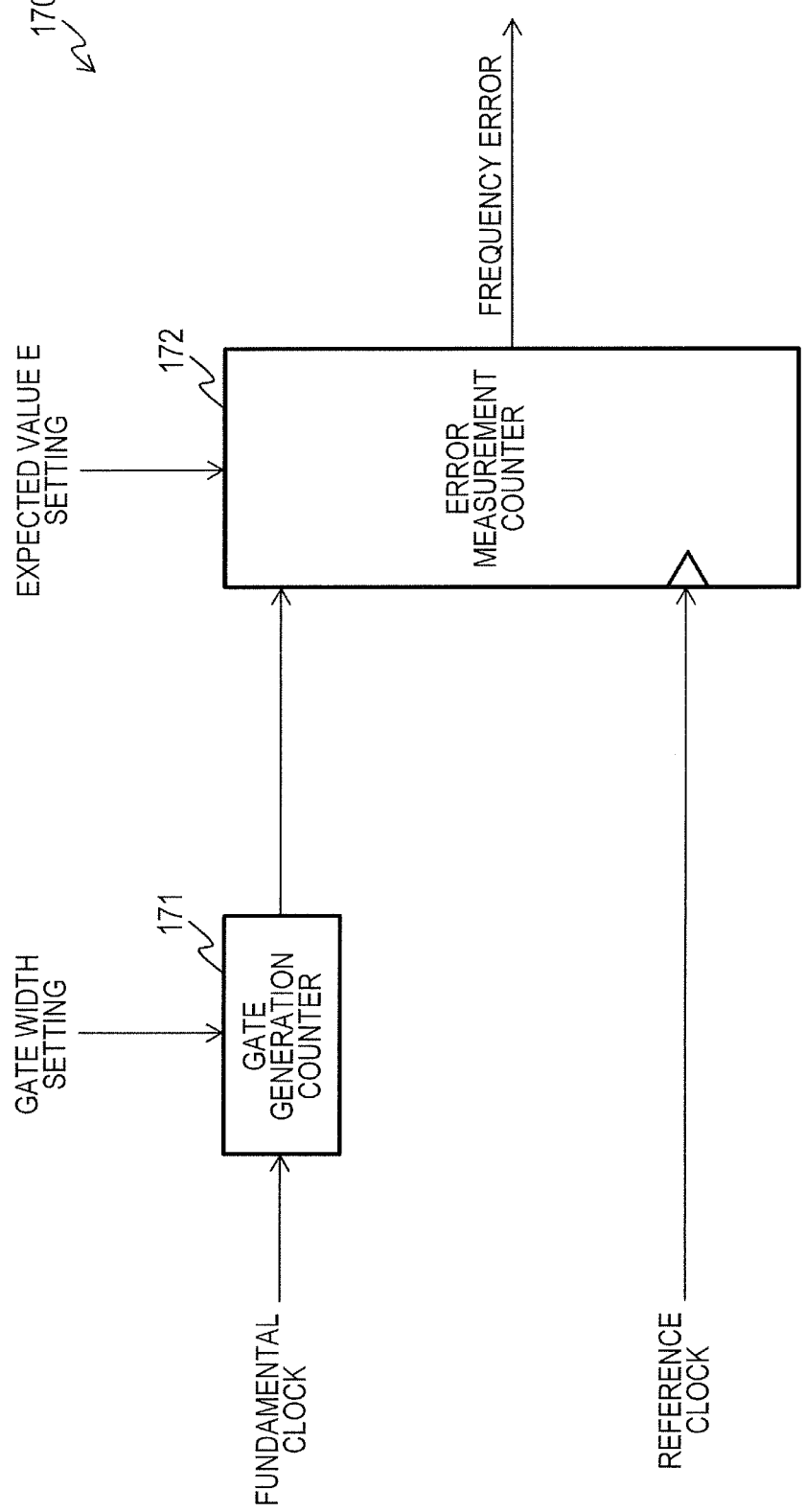
FIG. 16 is a block diagram showing the internal configuration of a frequency error detector according to the first embodiment of the present invention.

The clock correction circuit 100 includes the frequency error detector 170. The frequency error detector 170 calculates the frequency error of the fundamental clock (a) with the use of the reference clock. FIG. 16 is a block diagram showing the internal configuration of the frequency error detector 170. The frequency error detector 170 includes a gate generation counter 171 and an error measurement counter 172. The gate generation counter 171 counts the clock pulses of the fundamental clock (a) generated by the clock oscillator 210, and generates a gate signal with a gate width T set on the basis of the frequency of the fundamental clock (a). In the following descriptions, it will be assumed that the gate width T is 32,768 (the unit of the gate width 32,768 is one period of the fundamental clock (a)). In other words, if the fundamental clock (a) has no error, the gate generation counter 171 generates a gate signal with its gate width of 1 sec because the frequency of the fundamental clock (a) is 32.768 kHz.

The error measurement counter 172 counts the reference clock generated by the reference oscillator 230, and enables the gate signal generated by the gate generation counter 171. Successively, the error measurement counter 172 calculates the difference between the count number obtained by counting the reference clock within the time period set by the gate signal and the expected value E of the count number set in advance as a frequency error. Here, the expected value E is set to "14400000" if the reference clock is 14.4 MHz. The error measurement counter 172 supplies the calculated frequency error to the CPU 300. The CPU 300 calculates a correction value by substituting the calculated error into the above-mentioned [Expression 1], and supplies the correction value to the operation clock generation circuit 110.

<Detailed Configuration Example 3 of MCU 10>

Figure 17:
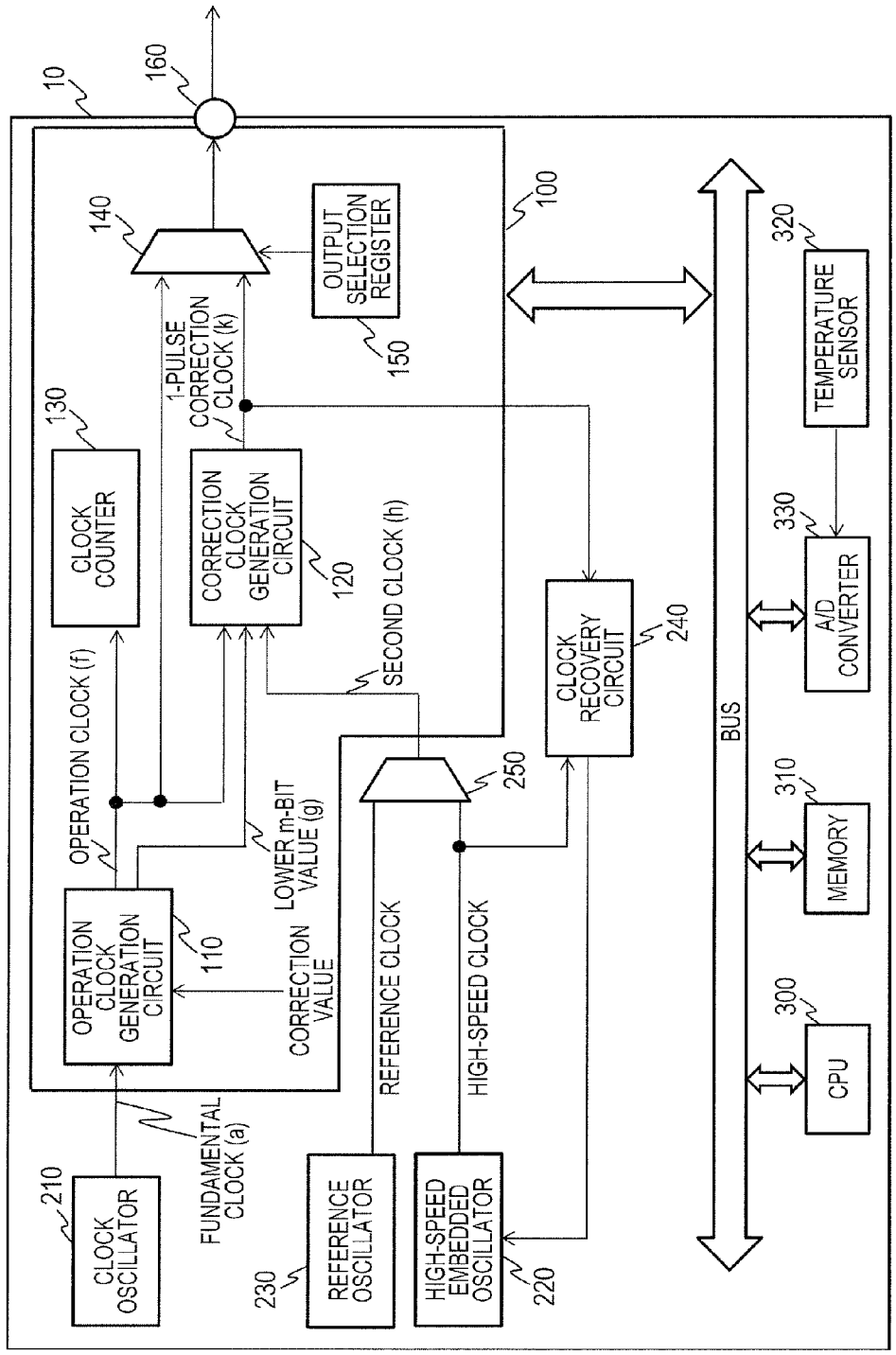
FIG. 17 is a block diagram showing another configuration example of the MCU including the clock correction circuit according to the first embodiment of the present invention.

It is conceivable that the MCU 10 includes a clock recovery circuit. FIG. 17 is a block diagram showing another configuration example of the MCU 10 including the clock recovery circuit. The MCU 10 includes the clock recovery circuit 240 and a selector 250.

The selector 250 supplies one or the other of the reference clock and the high-speed clock to the correction clock generation circuit 120 as the second clock (h) taking power consumption and an application for which the clock signal output from the external terminal 160 is used into consideration.

The high-speed clock generated by the high-speed embedded oscillator 220 and the 1-pulse correction clock (k) generated by the correction clock generation circuit 120 are supplied to the clock recovery circuit 240. The clock recovery circuit 240 measures the frequency of the high-speed clock with using the 1-pulse correction clock (k), and performs the trimming (capacitor adjusting) of the high-speed embedded oscillator 220 with the use of the measured result.

Figure 18:
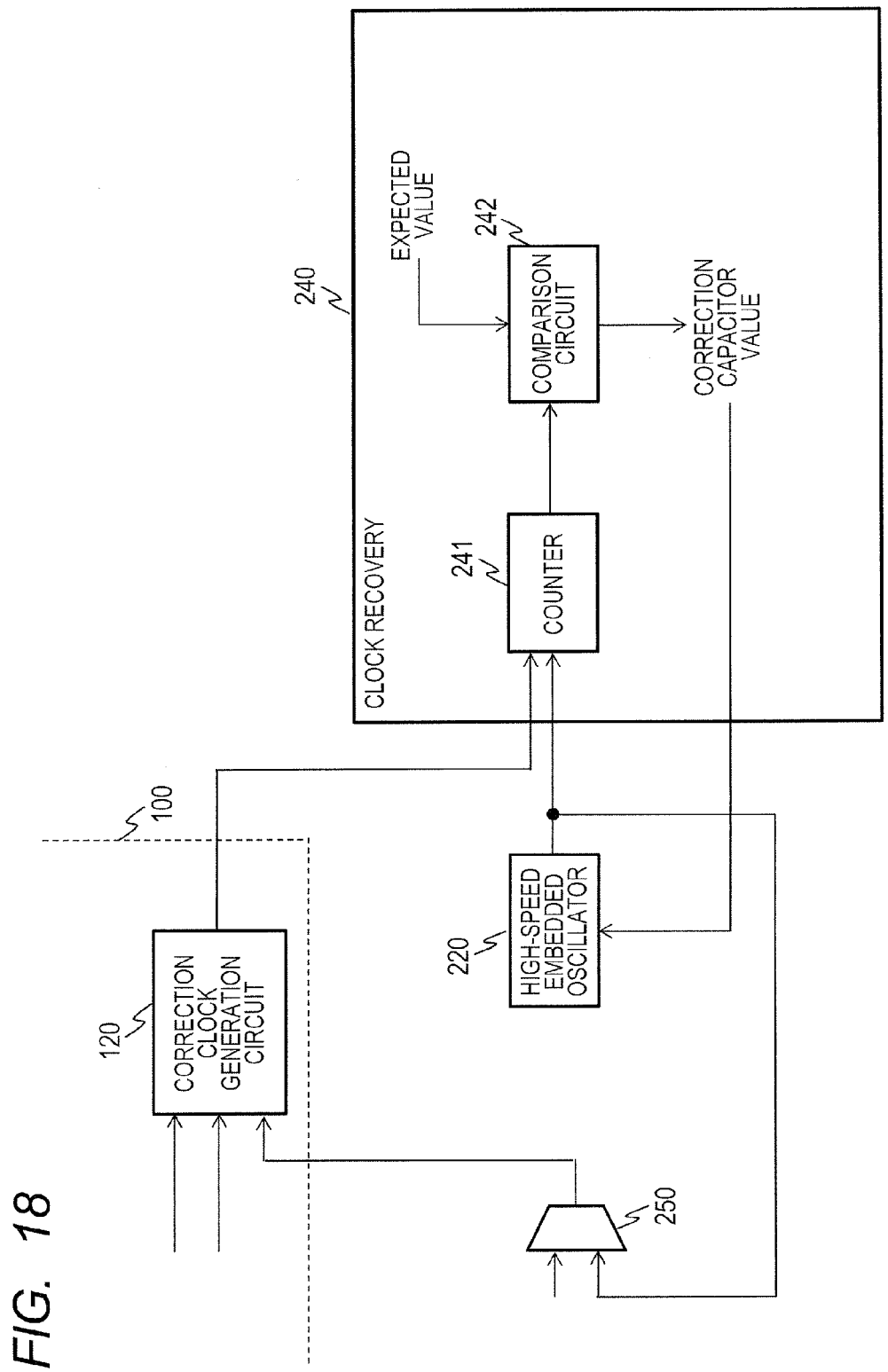
FIG. 18 is a block diagram showing the internal configuration of a clock recovery circuit according to the first embodiment of the present invention.

FIG. 18 shows the detailed configuration of a clock recovery circuit 240. The clock recovery circuit 240 includes a counter 241 and a comparison circuit 242. In addition, the clock recovery circuit 240 includes a register that stores an after-mentioned expected value although the register is not shown.

The counter 241 counts the input number of the clock pulses of the high-speed clock during the time that the predefined number of the clock pulses of the 1-pulse correction clock (k) are input. The counter 241 supplies the counted number to the comparison circuit 242.

The comparison circuit 242 reads out the expected value of the high-speed clock, that is, the required frequency from the unshown register (or from an arbitrary storage device). The comparison circuit 242 compares the read-out expected value and the counted number. If both are equal to each other, the comparison circuit 242 judges that the high-speed clock is running at the desired frequency. If both are different from each other, the comparison circuit 242 judges that there is a difference between the frequency of the high-speed clock and the desired frequency. The comparison circuit 242 examines whether the frequency of the high-speed clock is shifting to a higher direction or a lower direction compared with the desired frequency. Successively, the comparison circuit 242 increments or decrements the correction capacitor value by ±1 on the basis of the direction of the frequency shift. The comparison circuit 242 calculates the appropriate correction capacitor by repeating this adjusting operation of the correction capacitor value until the read-out expected value becomes equal to the counted number, and obtains an appropriate correction capacitor value. Successively, the comparison circuit 242 supplies this capacitor value to the high-speed embedded oscillator 220.

The high-speed embedded oscillator 220 reflects the capacitor value supplied by the comparison circuit 242 in the variable capacitor and the like of the high-speed embedded oscillator 220 to adjust the frequency error.

The reason why the counter 241 uses the 1-pulse correction clock (k) will be described hereinafter. If the counter 241 uses the operation clock (f), it is necessary for the counter 241 to continue performing the count processing of the high-speed clock until the correction of the operation clock (f) is made at the earliest, which takes a long time. On the other hand, if the counter 241 uses the 1-pulse correction clock (k), it is not necessary for the counter 241 to continue performing the count processing of the high-speed clock for a long time because the frequency adjustment for each clock pulse of the 1-pulse correction clock (k) has already been performed, which brings about a shorter counting time. As a result, the shorter counting time leads to low-current consumption.

In addition, in the case where the 1-pulse correction clock (k) is used, the maximum count number required of the counter 241 can be reduced. Therefore, the circuit size of the counter 241 can be reduced. From the viewpoint of the current consumption and the circuit size of the counter 241, it is desirable that a pulse supplied to the clock recovery circuit 240 is the 1-pulse correction clock (k) the frequency error of each clock pulse of which has sequentially been corrected.

Second Embodiment

The clock correction circuit 100 according to a second embodiment of the present invention is characterized in that the current consumption of the operation clock generation circuit 110 of the clock correction circuit 100 according to the second embodiment can be reduced compared with that of the operation clock 110 of the clock correction circuit 100 according to the first embodiment. Hereinafter, the description will be made about different points between the clock correction circuit 100 according to the second embodiment and the clock correction circuit 100 according to the first embodiment.

Figure 19:
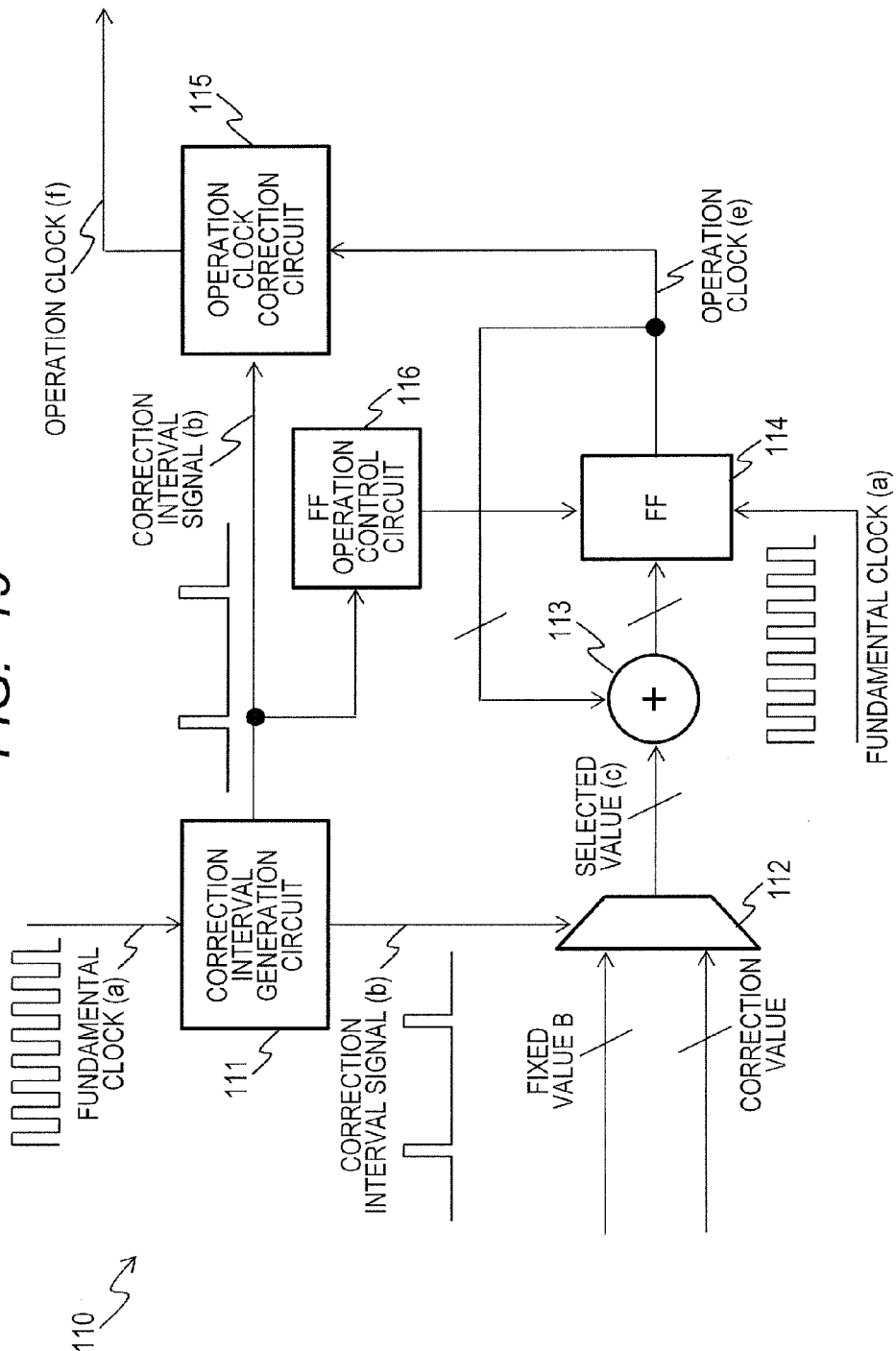
FIG. 19 is a block diagram showing the configuration of an operation clock generation circuit according to a second embodiment of the present invention.

The difference between the clock correction circuit 100 according to the second embodiment and that according to the first embodiment resides only in the configurations of the operation clock generation circuits 110 of both clock correction circuits 100, therefore only the operation clock circuit 110 according to the second embodiment will be described below in comparison with the operation clock circuit 110 according to the first embodiment. FIG. 19 is a block diagram showing the configuration of the operation clock generation circuit 110 according to this embodiment.

Figure 4:
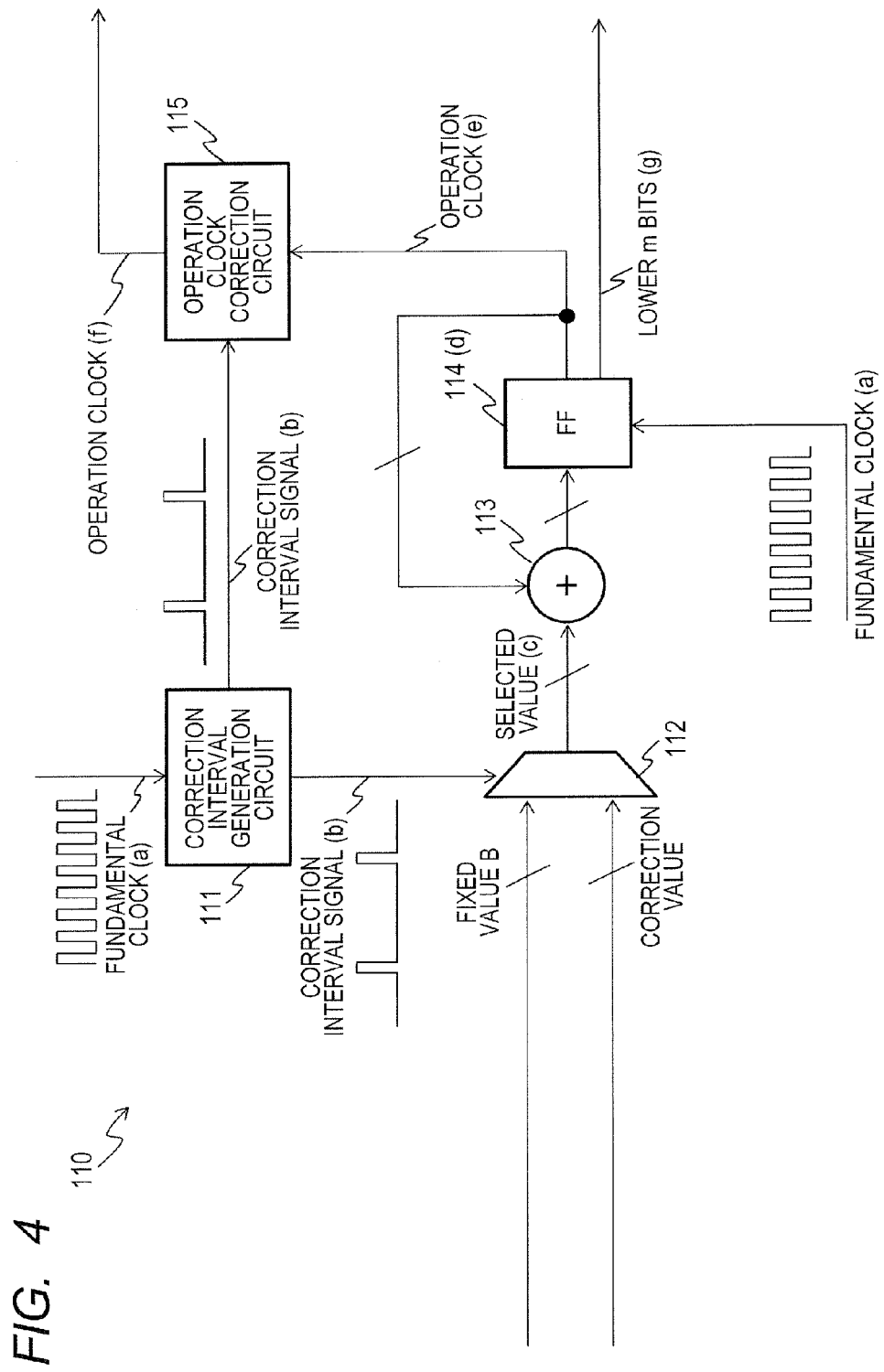
FIG. 4 is a block diagram showing the configuration of an operation clock generation circuit according to the first embodiment of the present invention.

The operation clock generation circuit 110 according to this embodiment includes an FF operation control circuit 116 as well as the components shown in FIG. 4. The correction interval signal (b) is supplied to the FF operation control circuit 116. In the following descriptions, it will be assumed that the flip-flop 114 has a register shown in FIG. 5, that is, a 21-bit register. In addition, the correction interval signal (b) is a one-shot pulse that has one high-level clock pulse among 32,768 clock pulses.

The FF operation control circuit 116 controls the operation of the flip-flop 114 in accordance with the correction interval signal (b). To put it concretely, the FF operation control circuit 116 controls the operation of the flip-flop 110 so that the 16th-highest bit of the register is incremented when the correction interval signal (b) is low-level. The value of the 16th-highest bit of the register is equivalent to the above-described fixed value B. In this case, the FF operation control circuit 116 controls the operation of the flip-flop 114 lest the flip-flop 114 should bring in a value from the adder 113. In addition, the FF operation control circuit 116 controls the operation of the flip-flop 114 lest the flip-flop 114 should input a value to the adder 113. On the other hand, the FF operation control circuit 116 brings in an output value from the adder 113 only when the correction interval signal (b) is high-level, and reflects the output value in the register value (d).

In other words, the FF operation control circuit 116 controls the adder 113 so that the adder 113 performs addition processing during one clock pulse among 32,768 clock pulses, and the FF operation control circuit 116 controls the flip-flop 114 so that the register of the flip-flop 114 functions only as an up-counter during other clock pulses.

Owing to the above-described configuration of the operation clock generation circuit 110, the number of addition calculations can be greatly reduced, and the flip-flop 114 functions only as a counter ng almost all the time. Because the count processing is a simple kind of processing, the current consumption of the operation clock 110 according to this embodiment can be greatly reduced compared with that of the operation clock 110 according to the first embodiment. In recent years, there are very many cases where the clock correction circuits 100 (RTCs) are used in a stand-by mode setting. Therefore, it is required for the clock correction circuits 100 (RTCs) in a stand-by mode to consume only ultralow currents. The operation clock generation circuit 110 according to this embodiment is configured to perform addition calculations as few times as possible, therefore the request of the ultralow current consumption in the stand-by mode can be achieved by the configuration of the operation clock generation circuit 110 according to this embodiment.

Another Embodiment

By the way, the RTC circuit disclosed in Japanese Unexamined Patent Application Publication No. 2000-315121 is also configured to be able to generate a clock signal equivalent to the operation clock. It is also possible to replace parts of component circuits of the clock correction circuit 100 according to the first embodiment with some circuits disclosed in Japanese Unexamined Patent Application Publication No. 2000-315121. The above-mentioned configuration will be described in detail hereinafter.

Figure 20:
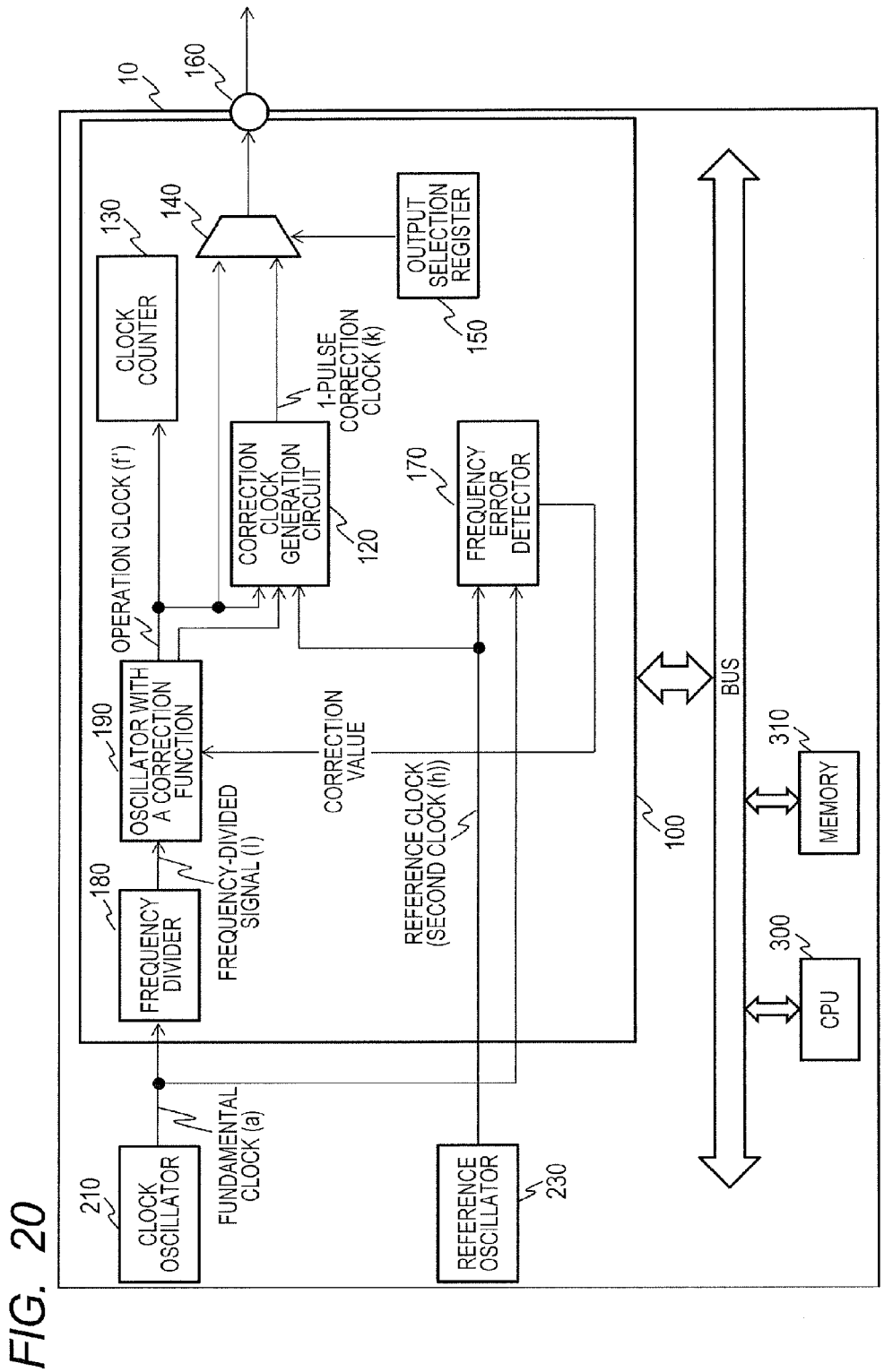
FIG. 20 is a block diagram showing a configuration example of an MCU including a clock correction circuit according to another embodiment of the present invention.

FIG. 20 is a block diagram showing the configuration of a clock correction circuit 100 to which circuits included by the RTC circuit disclosed in Japanese Unexamined Patent Application Publication No. 2000-315121 are applied. The clock correction circuit 100 includes a frequency divider 180 and an oscillator 190 with a correction function instead of the operation clock generation circuit 110. Here, components that are the same as the components shown in FIG. 3 are given the same numeric signs, and the detail descriptions about them will be omitted. Hereinafter, the configuration of the clock correction circuit 100, in which the 1-pulse correction clock (k) brings about a correction accuracy higher than 1 ppm as is the case with the first embodiment, will be described.

The frequency divider 180 generates a frequency-divided signal (l) obtained by dividing the fundamental clock (a). It is all right that the frequency divider 180 has the configuration of a common frequency divider, and for example, it can be an asynchronous counter configured with plural flip-flops. In the following descriptions, it will be assumed that the frequency divider 180 is a $2^{14}$ frequency-divided circuit. In other words, the frequency divider 180 generates a 2 Hz frequency-divided signal (l) from the fundamental clock (a).

Figure 21:
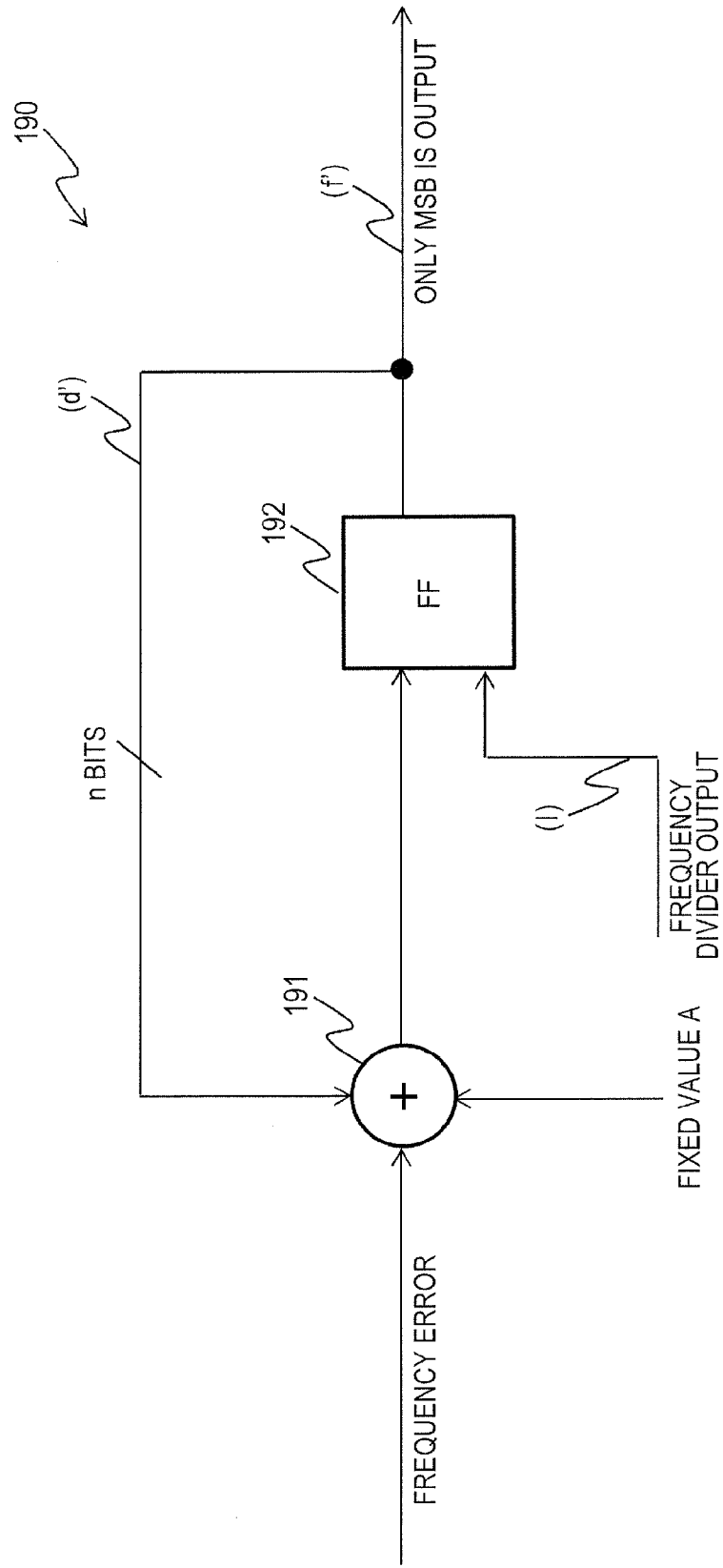
FIG. 21 is a block diagram showing the configuration of an oscillator with a correction function according to the another embodiment of the present invention.

The oscillator 190 with a correction function generates an operation clock (f'). The configuration example of the oscillator 190 with a correction function is shown in FIG. 21. The oscillator 190 with a correction function includes an adder 191 and a flip-flop (FF) 192.

The adder 191 adds a frequency error calculated by the frequency error detector 170, a fixed value A, and an output value of the flip-flop 192. Here, let us assume that the fixed value A is "2000H". A calculation method of the frequency error is almost the same as the calculation method shown in FIG. 6. For example, 0.95 ppm is equivalent to 1H.

The flip-flop 192 includes an n-bit register (a register value (d')) inside. The following descriptions will be made under the assumption that n=18. The flip-flop 192 brings in the output value of the adder 191 in the n-bit register with the use of the frequency-divided signal (l) as an input to the clock terminal. In addition, the flip-flop 192 generates the operation clock (f') that changes its value at the timing when the MSB (Most Significant Bit) of the register value (d') changes. In addition, the flip-flop 192 supplies the lower m (m=17)-bit value (g') of the register value (d') to a counter initial value calculation circuit 121 of the correction clock generation circuit 120.

FIG. 22 is a diagram showing the register value (d') of the flip-flop 192. This register value (di) almost corresponds to the register value (d) shown in FIG. 5, but it is different in that this register value (d') does not have a sign bit to show whether the value (d') is positive or negative, and that the bit width of the lower m-bit value (g') is larger.

As described above, even if the configuration of the oscillator 190 with a correction function is similar to that disclosed in Japanese Unexamined Patent Application Publication No. 2000-315121, the oscillator 190 with a correction function generates the operation clock (f') by accumulatively adding the frequency errors. The correction clock generating circuit 120 can generates the 1-pulse correction clock (k) with the use of this operation clock (f') and the lower m-bit value (g').

Next, the clock correction circuit 100 according to the first embodiment (shown in FIG. 3 and the like) and the clock correction circuit 100 shown in FIG. 20 will be compared with each other. In the configuration according to the first embodiment, because the operation clock (f) is generated from the fundamental clock (a) of the frequency 32.768 kHz, the maximum error of the operation clock (f) can be set to 30.5 ppm (1 Hz/32.768 kHz). Therefore, in order to realize the correction accuracy of 1 ppm, the lower m-bit value (g) can be set to a 5-bit value. On the other hand, in the configuration shown in FIG. 20, because the operation clock (f') is generated from the frequency-divided signal 2 Hz, the maximum error of the operation clock (f') becomes larger than the maximum error (30.5 ppm) of the operation clock (f). Therefore, the bit width of the lower m-bit value (g') becomes larger than the bid width of the lower m-bit value (g) according to the first embodiment. To put it concretely, the lower m-bit value (g') becomes a 17-bid value.

In the first embodiment, because the bit width of the lower m-bit value (g) can be set small, the counting time of the second clock (h) can be set short. Therefore, even if the second clock (h) has a little large error, the required accuracy to the 1-pulse correction clock (k) can be satisfied. For example, even if the above-mentioned high-speed embedded oscillator 220 outputs the high-speed clock (the second clock (h)) with about a 5% accuracy error, the 1-pulse correction clock (k) can satisfy an accuracy of about ±3 ppm.

In addition, in the first embodiment, the bit width of the lower m-bit value (g) can be small, the circuit size of the counter initial value calculation circuit 121 (the so-called decoder) can be small.

In addition, in the first embodiment, the correction value and the register value (d) are represented in a complement format that can represent both positive number and negative number. Therefore, the configuration of the clock correction circuit 100 according to the first embodiment is different from that shown in FIG. 20, and even if the fundamental clock (a) has a positive frequency error (represented in units of ppm) or a negative frequency error (represented in units of ppm), the frequency error can be dealt with.

Although the present invention has been described with reference to some above-mentioned embodiments, the present invention is not limited by the configurations of the above-mentioned embodiments, and it is obvious that various changes, modifications, and combinations that may be made by those skilled in the art within the scope of the following claims are included in the present invention.

For example, although an example in which the clock correction circuit 100 is used inside the power meter 1 has been described, the usage of the clock correction circuit 100 is not limited to the above example. The above-described clock correction circuit 100 can be embedded, for example, in any types of in-vehicle systems; mobile terminals such as a mobile phone, a smart phone; any types of personal computers, and the like.

Parts or the entirety of the above described embodiments can be rewritten in the following additional statements, although the parts or the entirety of the above described embodiments can be rewritten in statements other than the following additional statements.

(Additional Statement 1)

A micro controller having an external terminal for outputting a clock signal, the micro controller comprising:

an output selection register that stores a clock type to be output; and a selector that selects a clock signal on the basis of a value stored by the output selection register out of a clock signal group including an operation clock on which a frequency error correction is performed at first intervals on the basis of a first clock, and a correction clock on which the frequency error correction is performed at second intervals that are shorter than the first intervals on the basis of the first clock, and outputs the selected clock signal via the external terminal.

(Additional Statement 2)

The micro controller according to the Additional Statement 1, wherein the correction clock is a 1-pulse correction clock signal the pulse width of each pulse of which is corrected.

(Additional Statement 3)

The micro controller according to the Additional Statement 1, further comprising a calculation unit that calculates an electric power accounting amount on the basis of electric power information measured by a measurement LSI; table information showing the relation between the amount of electric energy consumption and the corresponding accounting amount for each time zone; and time information measured on the basis of the operation clock.

(Additional Statement 4)

A power meter device comprising:

the micro controller according to the Additional Statement 3; and a panel device for displaying the electric power accounting amount.

What is claimed is:

1. A real-time clock circuit, comprising:
a clock correction circuit that receives a first clock having a first frequency and generates a second clock having a second frequency; and
a correction register that stores a first value corresponding to a correction resolution value,
wherein the first value is translated to a second value per a predetermined number of seconds,
wherein the clock correction circuit adjusts, at interval of the predetermined number of seconds, the second clock when a time calculated based on the second value has elapsed.

2. The real-time clock circuit according to claim 1, wherein the correction resolution value is parts per million unit.

3. The real-time clock circuit according to claim 1, wherein the predetermined number of seconds is one second, the second frequency is 1 Hz and the second value is less than one second.

4. The real-time clock circuit according to claim 1,
wherein the correction register further stores a third value corresponding to the predetermined number of seconds,
wherein the clock correction circuit adjusts the second clock at interval of the predetermined number of seconds using the second and third values.

5. The real-time clock circuit according to claim 4,
wherein the clock correction circuit generates a correction timing using the first clock and the third value and translates the first value to the second value at the correction timing.

6. A real-time clock circuit, comprising:
a clock correction circuit that receives a first clock having a first frequency and generates a second clock having a second frequency; and
a correction register that stores a first value corresponding to a correction resolution value,
wherein the first value is translated to a second value per a predetermined number of seconds,
wherein the clock correction circuit adjusts the second clock at interval of the predetermined number of seconds using the second value,
wherein the correction register further stores a third value corresponding to the predetermined number of seconds,
wherein the clock correction circuit adjusts the second clock at interval of the predetermined number of seconds using the second and third values,
wherein the second value is determined based on $(1/(x*y))$, where x is the first value and y is the third value.

7. The real-time clock circuit according to claim 1, further comprising a counter, wherein:
an initial value of the counter is set based on the second value, and
the clock correction circuit adjusts, at the interval of the predetermined number of seconds, the second clock when a value of the counter reaches a predetermined value.

8. The real-time clock circuit according to claim 7, wherein the value of the counter increments or decrements upon each clock pulse of a third clock having a third frequency that is higher than the first and second frequencies.

* * * * *